(12) United States Patent
Urs et al.

(10) Patent No.: US 12,656,422 B2
(45) Date of Patent: Jun. 16, 2026

(54) TUNNEL MAGNETORESISTIVE MULTI-TURN SENSOR

(71) Applicant: Analog Devices International Unlimited Company, Limerick (IE)

(72) Inventors: Onur Necdet Urs, Hamburg (DE); Jan Kubik, Limerick (IE); Fernando Franco, Limerick (IE); Jochen Schmitt, Biedenkopf (DE)

(73) Assignee: Analog Devices International Unlimited Company, Limerick (IE)

( * ) Notice: Subject to any disclaimer, the term of this patent is extended or adjusted under 35 U.S.C. 154(b) by 226 days.

(21) Appl. No.: 18/067,562

(22) Filed: Dec. 16, 2022

(65) Prior Publication Data

US 2024/0111005 A1 Apr. 4, 2024

Related U.S. Application Data

(60) Provisional application No. 63/378,287, filed on Oct. 4, 2022.

(51) Int. Cl.
*G01R 33/09* (2006.01)
*G01D 5/16* (2006.01)
*H10N 59/00* (2023.01)

(52) U.S. Cl.
CPC ............ *G01R 33/098* (2013.01); *G01D 5/16* (2013.01); *G01R 33/091* (2013.01); *G01R 33/093* (2013.01); *H10N 59/00* (2023.02)

(58) Field of Classification Search
CPC .. G01R 33/098; G01R 33/091; G01R 33/093; G01D 5/16; H10N 59/00
See application file for complete search history.

(56) References Cited

U.S. PATENT DOCUMENTS 7,034,519 B2 * 4/2006 Abraham ........... G01R 31/2648
324/754.03
7,495,434 B2 2/2009 Zimmer et al.
(Continued)

FOREIGN PATENT DOCUMENTS

CN 105571618 A * 5/2016
DE 102010010893 A1 9/2010
DE 102016111995 A1 1/2018

OTHER PUBLICATIONS

"U.S. Appl. No. 18/067,568, Non Final Office Action mailed Aug. 14, 2024", 18 pgs.

(Continued)

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

The present disclosure provides tunnel magnetoresistive (TMR) multi-turn (MT) sensors with improved sensor read-out and methods of manufacturing said sensors. In some examples, the TMR sensing elements of the MT sensor are each provided with two or more electrical contacts for performing current-in-plane tunnelling measurements. The two or more electrical contacts may be provided above or below the TMR sensing elements. In further examples, one or more read-out pillars formed from TMR sensing material may be provided, the read-out pillars being electrically connected to one or more TMR sensing elements. The read-out pillars are configured such that the resistance observed in the read-out pillars is negligible or near-negligible relative to that observed in the TMR sensing elements, such that the measured output signal only reflects the change in resistance experience by the TMR sensing elements in the presence of an externally rotating magnetic field. In the arrangements described herein, the length of the TMR (Continued)

sensing elements can be significantly reduced and tighter sensor spiral can be achieved, thus reducing the overall size and defectivity of the MT sensor.

20 Claims, 42 Drawing Sheets

(56) References Cited

U.S. PATENT DOCUMENTS

| | | | |
|---|---|---|---|
| 7,671,583 | B2 | 3/2010 | Diegel et al. |
| 7,863,911 | B2* | 1/2011 | Hong ..................... B82Y 25/00 |
| | | | 324/715 |
| 9,606,197 | B2 | 3/2017 | Zimmer et al. |
| 10,415,998 | B2* | 9/2019 | Dietrich ............. G01D 5/24476 |
| 12,298,365 | B2 | 5/2025 | Urs et al. |
| 2008/0100289 | A1 | 5/2008 | Zimmer et al. |
| 2014/0103474 | A1 | 4/2014 | Lee et al. |
| 2014/0291788 | A1 | 10/2014 | Zimmer et al. |
| 2018/0372510 | A1 | 12/2018 | Mattheis et al. |
| 2019/0383643 | A1 | 12/2019 | Schmitt et al. |
| 2021/0288557 | A1 | 9/2021 | Komasaki et al. |
| 2022/0075010 | A1* | 3/2022 | Meehan ............... G01R 33/098 |
| 2022/0336734 | A1* | 10/2022 | Aggarwal ............. H10N 50/80 |
| 2024/0111006 | A1 | 4/2024 | Necdet Urs et al. |

OTHER PUBLICATIONS

"International Application Serial No. PCT/EP2023/077249, International Search Report mailed Jan. 18, 2024", 4 pgs.

"International Application Serial No. PCT/EP2023/077249, Written Opinion mailed Jan. 18, 2024", 7 pgs.

"International Application Serial No. PCT/EP2023/077256, International Search Report mailed Jan. 26, 2024", 5 pgs.

"International Application Serial No. PCT/EP2023/077256, Written Opinion mailed Jan. 26, 2024", 7 pgs.

Lee, Ching-Ming, "Current-in-plane Tunneling Measurement through Patterned Contacts on Top Surfaces of Magnetic Tunnel Junctions", Journal of Magnetics, 16(2), (2011), 169-172.

"U.S. Appl. No. 18/067,568, Response filed Nov. 13, 2024 to Non Final Office Action mailed Aug. 14, 2024", 10 pgs.

"U.S. Appl. No. 18/067,568, Notice of Allowance mailed Jan. 21, 2025", 9 pgs.

* cited by examiner 1200 um 100 um

616

618

620

926    924

928

932    930

934

1200E

1202E

1206E

1212E

1204E

TUNNEL MAGNETORESISTIVE MULTI-TURN SENSOR

CLAIM OF PRIORITY

This application claims the benefit of priority of U.S. Provisional Application Ser. No. 63/378,287, filed Oct. 4, 2022, which is hereby incorporated by reference herein in its entirety.

FIELD OF INVENTION

The present disclosure relates to a tunnel magnetoresistive (TMR) multi-turn sensor. In particular, the present disclosure relates to a tunnel magnetoresistive multi-turn (MT) sensor with improved sensor read-out.

BACKGROUND

Magnetic multi-turn sensors are commonly used in applications where there is a need to monitor the number of times a device has been turned. An example is a steering wheel in a vehicle. Magnetic multi-turn sensors often include giant magnetoresistance (GMR) elements that are sensitive to an applied external magnetic field. The resistance of the GMR elements can be changed by rotating a magnetic field within the vicinity of the sensor, which causes magnetic domain walls to propagate through the sensor, which in turn causes the measured resistance of each sensing element to change. Variations in the resistance of the GMR elements can be tracked to determine the number of turns in the magnetic field, which can be translated to a number of turns in the device being monitored.

The GMR sensor elements are typically arranged in an open or closed loop spiral configuration, however, GMR-based multi-turn (MT) sensors require a long resistor length (~100 μm) to achieve reasonable resistance values of around 1-2 kΩ to be able to measure change of resistance of an order of around 5%. This drives up die size and increases the occurrence of defects in the spiral, thus affecting the functionality of the device.

SUMMARY

The present disclosure provides tunnel magnetoresistive (TMR) multi-turn (MT) sensors with improved sensor read-out and methods of manufacturing said sensors. In some examples, the TMR sensing elements of the MT sensor are each provided with two or more electrical contacts for performing current-in-plane tunnelling measurements. The two or more electrical contacts may be provided above or below the TMR sensing elements. In further examples, one or more read-out pillars formed from TMR sensing material may be provided, the read-out pillars being electrically connected to one or more TMR sensing elements. The read-out pillars are configured such that the resistance observed in the read-out pillars is negligible or near-negligible relative to that observed in the TMR sensing elements, such that the measured output signal predominantly reflects the change in resistance experience by the TMR sensing elements in the presence of an externally rotating magnetic field. In the arrangements described herein, the length of the TMR sensing elements can be significantly reduced and tighter sensor spiral can be achieved, thus reducing the overall size and defectivity of the MT sensor compared to an implementation using GMR resistors.

A first aspect of the present disclosure provides a magnetic multi-turn sensor, comprising a length of tunnel magnetoresistive film arranged in a spiral configuration, a substrate on which the tunnel magnetoresistive film is formed, and a plurality of contacts for electrically connecting the tunnel magnetoresistive film, such that a plurality of tunnel magnetoresistive sensor elements connected in series are defined by said contacts, wherein the plurality of contacts are provided in a first plane above or below the tunnel magnetoresistive film.

As such, a tunnel resistive magnetic multi-turn sensor is provided, wherein the electrical contacts are all provided in the same plane, either above or below the tunnel magnetoresistive film, which allows the sensor to be formed from a shorter length of tunnel magnetoresistive film, resulting in a tighter sensor spiral. This reduces the likelihood of defects in the sensor and reduces the overall size of the sensing device.

In some arrangements, the plurality of contacts may be provided between the substrate and the tunnel magnetoresistive film. That is to say, the plurality of contacts are provided in a plane below the tunnel magnetoresistive film.

In such cases, each of the plurality of contacts may comprise a first metal layer, and a via provided between the first metal layer and the tunnel magnetoresistive film. The via may comprise a tungsten material. It will however be appreciated that the via may comprise any suitable electrically conductive material.

In some arrangements, each of the plurality of contacts may be provided at a position directly under a section of the tunnel magnetoresistive film. In such cases, the width of the via may be substantially the same width as the length of tunnel magnetoresistive film. That is to say, the electrical contacts and each respective via are aligned with the tunnel magnetoresistive film, with the vias having the same width as the tunnel magnetoresistive film. It will however be appreciated that the vias may be slightly smaller or larger in width than the tunnel magnetoresistive film, provided they are well aligned to ensure good electrical contact.

In other arrangements, each of the plurality of contacts may be provided at a position offset from a section of the tunnel magnetoresistive film. That is to say, the contacts are not provided directly below the tunnel magnetoresistive film. In such cases, each of the plurality of contacts may be connected to the tunnel magnetoresistive element by a second metal layer extending between each via and the respective section of the tunnel magnetoresistive film In some arrangement, the plurality of contacts may be provided above the tunnel magnetoresistive film. For example, the plurality of contacts may be formed in one or more protective layers formed on the tunnel magnetoresistive film. The one or more protective layers may comprise at least a first protective layer formed on the tunnel magnetoresistive film, the first protective layer comprising a plurality of openings to the tunnel magnetoresistive film. Each of the openings may be filled with a conductive material. For example, the conductive material may comprise tungsten. It will of course be appreciated than any suitable electrically conductive material may be used. A metal layer may be formed onto the conductive material of each respective opening to thereby provide one of the plurality of contacts.

The one or more protective layers may further comprise a second protective layer formed on the first protective layer, the first protective layer having a thickness substantially smaller than a thickness of the second protective layer. In this respect, the openings in the first protective layer need to be very small so that the conductive material filling the openings does not touch the side walls of the tunnel magnetoresistive film since this could produce errors in the turn count, and thus the first protective layer must be relatively thin. A second, thicker protective layer is therefore provided over the first protective layer.

In further arrangements, the length of tunnel magnetoresistive film may comprise a plurality of tunnel magnetoresistive read-out pillars connected thereto, wherein each of the plurality of contacts is connected to a respective tunnel magnetoresistive read-out pillar. In such arrangements, the tunnel magnetoresistive read-out pillars may have a larger surface area than a surface area of each tunnel magnetoresistive sensor element of the tunnel magnetoresistive film. In doing so, the resistance change observed in the read-out pillars is near-negligible relative to the resistance chance observed in the sensor elements, and therefore does not affect the turn count of the sensor.

In some arrangements, each tunnel magnetoresistive sensor element may be connected to two or more contacts. In some arrangements, each tunnel magnetoresistive sensor element may be connected to four contacts. In this respect, it will be appreciated that only two contacts are required for measuring the TMR effect, however, an additional two contacts may be used to provide a reference measurement.

In the arrangements described above, the two or more contacts may be electrically connected to provide current in-plane tunnelling magnetoresistance measurements.

In the arrangements described above, the tunnel magnetoresistive film may be arranged in an open or closed spiral configuration. The tunnel magnetoresistive film may be arranged in a spiral configuration comprising two or more sides. Preferably, the tunnel magnetoresistive film may be arranged in a spiral configuration comprising four sides.

A second aspect of the present invention provides a magnet multi-turn system, comprising at least one integrated device die comprising a magnetic multi-turn sensor as described with respect to the first aspect of the present disclosure, and processing circuitry configured to process a signal output from the magnetic multi-turn sensor to determine a number of turns of an external magnetic field therefrom, the system further comprising a package substrate, wherein the at least one integrated device die is mounted onto the package substrate.

The at least one integrated device die may comprise a first integrated device die comprising the magnetic multi-turn sensor, and a second integrated device die comprising the processing circuitry. The first integrated device die may be formed on the second integrated device die. Alternatively, a single integrated device die comprising both the magnetic multi-turn sensor and the processing circuitry may be provided.

The at least one integrated device die may further comprise a magnetic angle sensor configured to detect an orientation of the external magnetic field. In this respect, a third integrated device die comprising the magnetic angle sensor may be provided. The third integrated device die may be placed adjacent to the first and second integrated device dies or provided in a stack comprising the first and second integrated device dies. Similarly, a single integrated device die comprising the magnetic multi-turn sensor, the magnetic angle sensor and the processing circuitry may be provided.

The package substrate may comprise a printed circuit board. The processing circuitry may comprise an application specific integrated circuit.

BRIEF DESCRIPTION OF THE DRAWINGS

The present disclosure will now be described by way of example only with reference to the accompanying drawings in which.

DETAILED DESCRIPTION

Magnetic multi-turn sensors can be used to monitor the turn count of a rotating shaft. To do this, a magnet is typically mounted to the end of the rotating shaft, the multi-turn sensor being sensitive to the rotation of the magnetic field as the magnet rotates with the shaft. Such magnetic sensing can be applied to a variety of different applications, such as automotive applications, medical applications, industrial control applications, consumer applications, and a host of other applications which require information regarding a position of a rotating component.

Figures 1A, 1B:
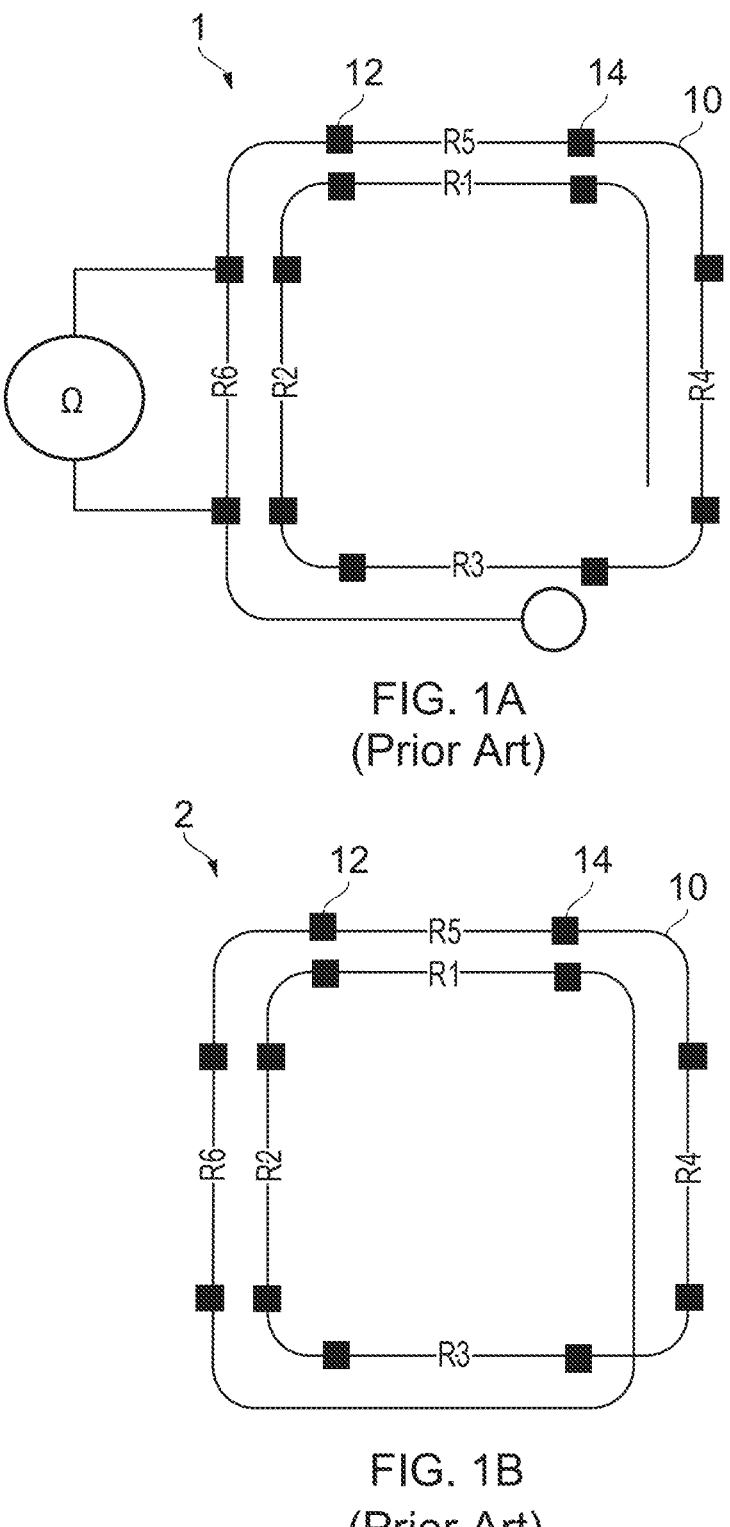
FIGS. 1A-C illustrate examples of giant magnetoresistive multi-turn sensors as known in the art.
Figure 1C:
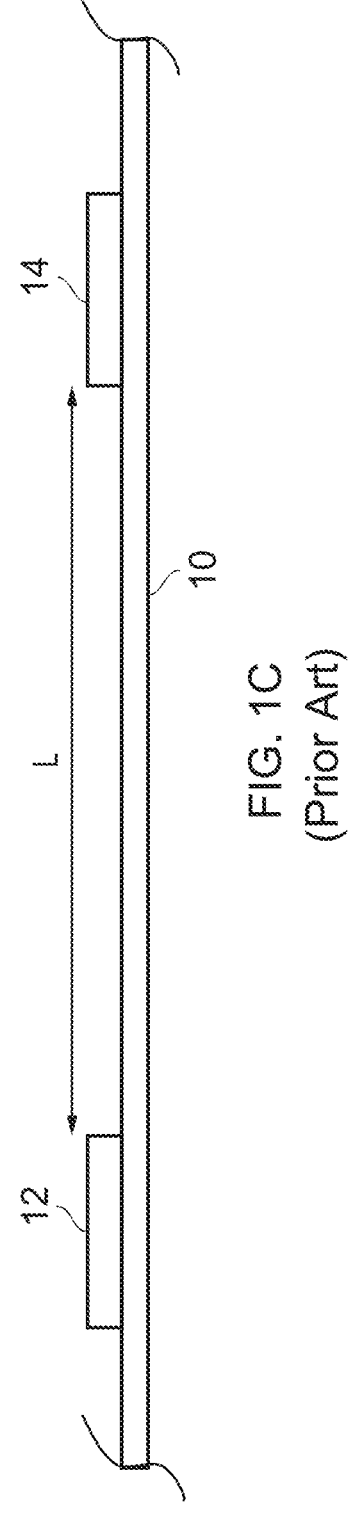
Figure 2:
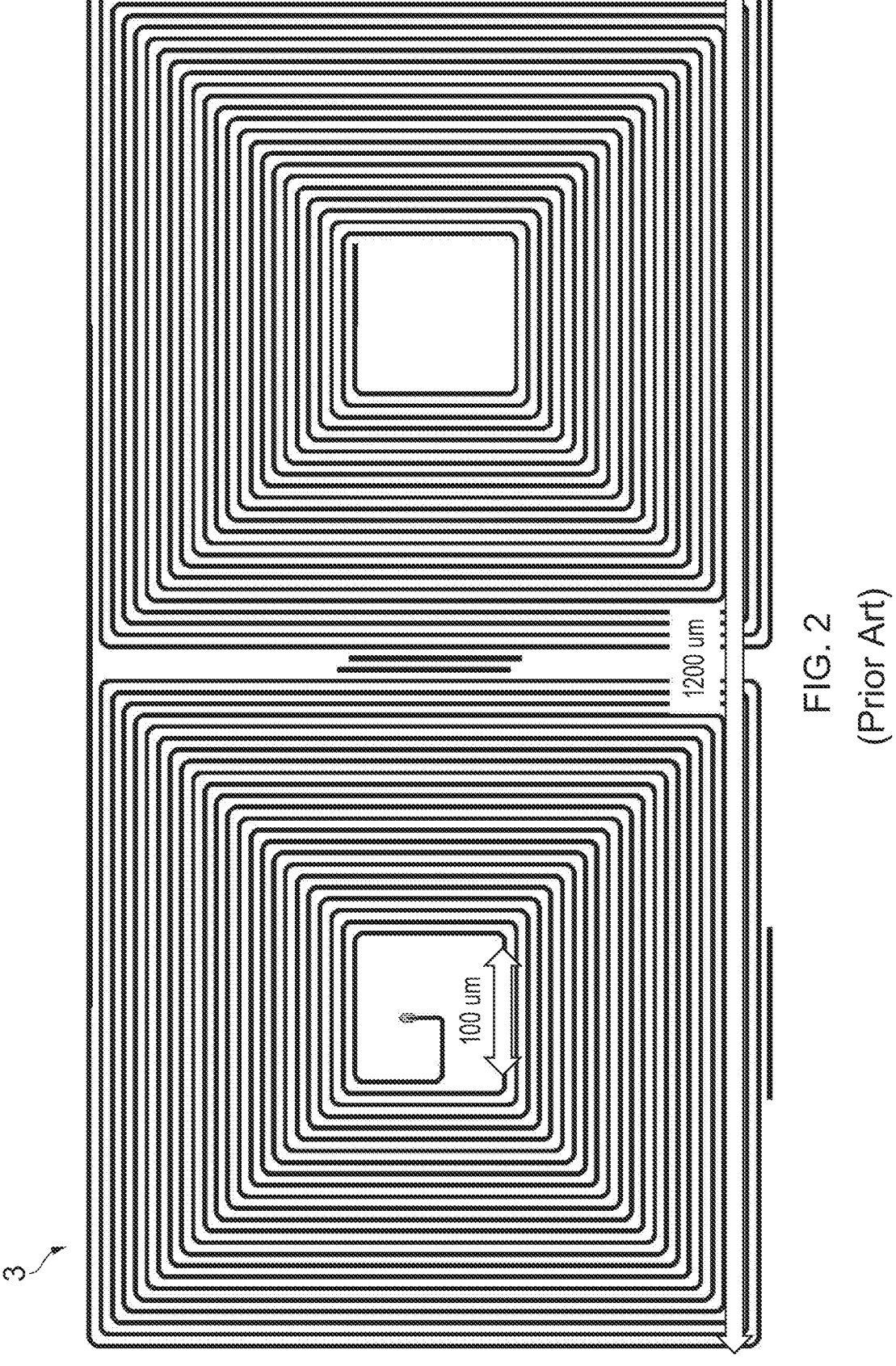
FIG. 2 illustrates an example of an open loop giant magnetoresistive multi-turn sensor as known in the art.

Magnetic multi-turn sensors typically include giant magnetoresistance (GMR) elements that are sensitive to an applied external magnetic field, the GMR sensor elements being typically arranged in an open or closed loop spiral configuration. FIG. 1A illustrates an example of an open loop GMR-based MT sensor 1, whilst FIG. 1B illustrates an example of closed loop GMR-based MT sensor 2. As can be seen, each MT sensor comprises a GMR film 10 having a width that is typically around 300-400 nm. The GMR film 10 is divided into a plurality of GMR sensing lengths R1-R6, wherein each sensing length R1-R6 has two electrical contacts 12, 14 disposed at each end. This further illustrated by FIG. 1C, which shows the GMR film 10 with two electrical contacts 12, 14 disposed thereon, the distance L between these two contacts 12, 14 being the measured resistor length. This is typically around 100 μm to achieve reasonable resistance values of around 1-2 kΩ to be able to measure change of resistance of an order of around 5%. This drives up die size, increases device spiral defectivity and lowers device yield. For example, FIG. 2 shows a GMR sensor with 46 spiral turns. This requires a very long GMR film to implement, which is very susceptible to defect and even a single defect can render the sensor unusable. Moreover, as the distance between each pair of contacts has to be same along each arm of the spiral, this results in a lot of unused and wasted GMR film as the spiral gets bigger.

Figure 3A:
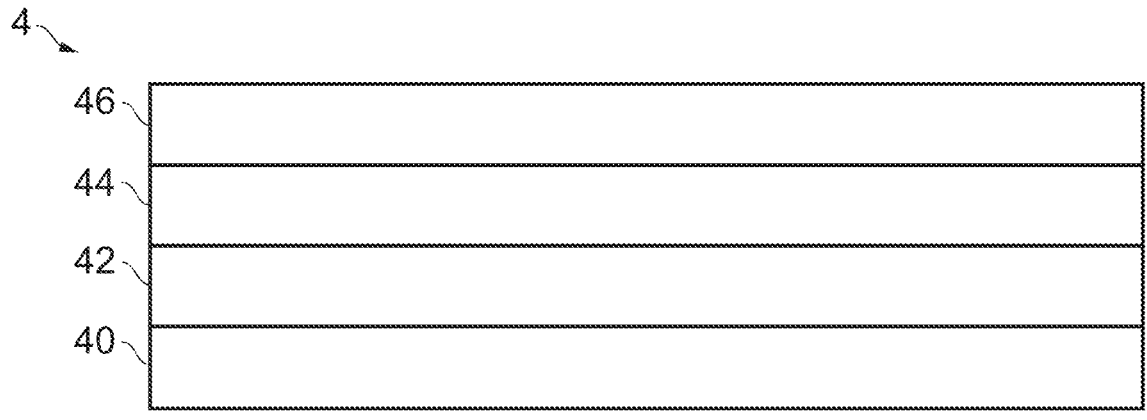
FIG. 3A illustrates an example of a tunnel magnetoresistive film.

The present disclosure seeks to remedy these problems by implementing a tunnel magnetoresistive (TMR) multi-turn sensor. The tunnel magnetoresistive effect occurs in a magnetic tunnel junction, which is a component consisting of two layers of ferromagnetic material separated by a thin insulator. FIG. 3A illustrates an example of a typical TMR film 4, comprising an antiferromagnetic pinning layer 40, a ferromagnetic reference layer 42, a tunnel barrier layer 44 and a ferromagnetic free layer 46. It will also be appreciated that other layers of material may also be provided. For example, a thin metal layer forming a bottom electrode, and a second metal layer forming a top electrode may also be provided at the top and bottom of the TMR film 4.

Figure 3B:
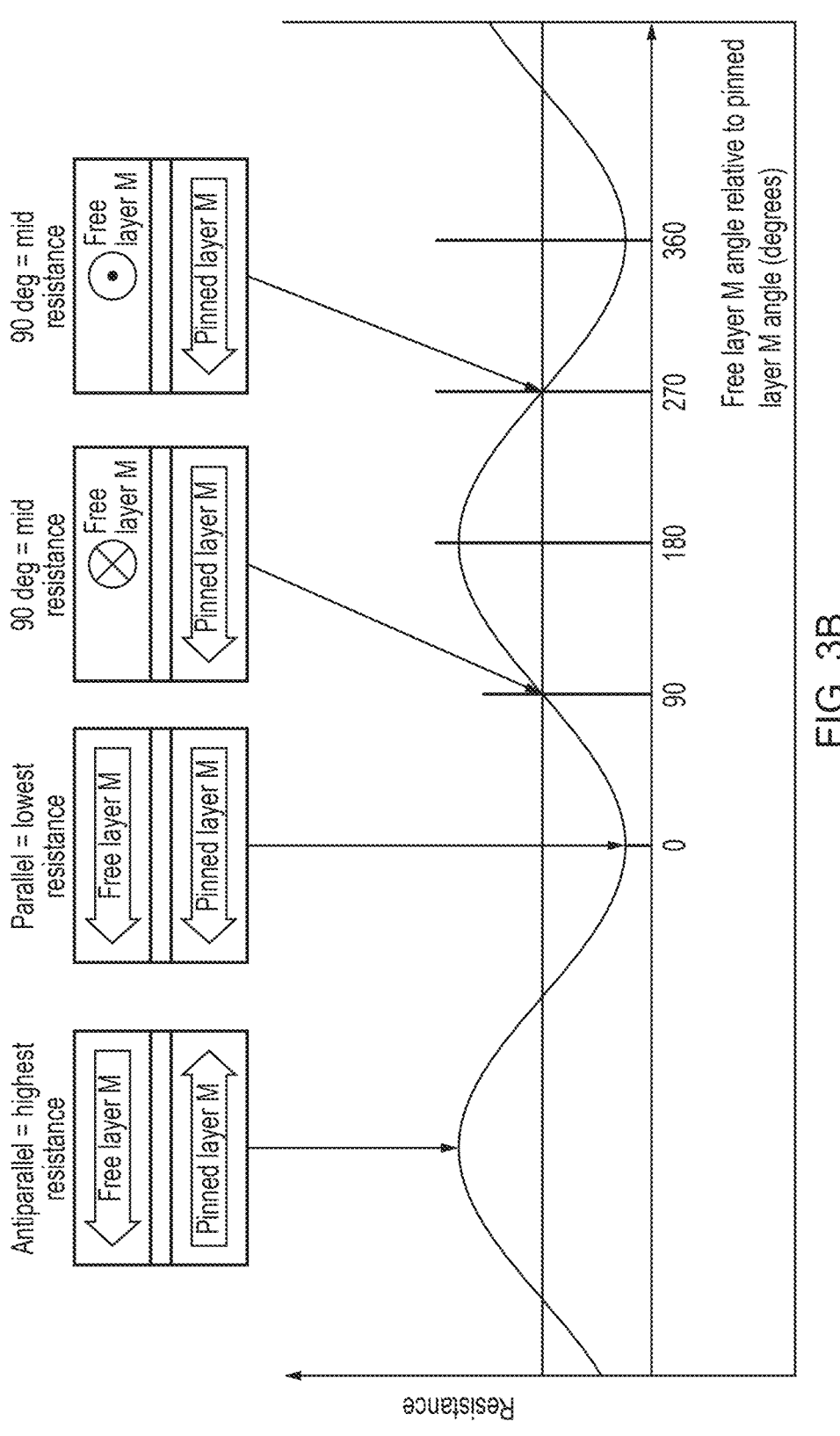
FIG. 3B is a graph illustrating the resistance change in a tunnel magnetoresistive multi-turn sensor.

The direction of the magnetisations of the two ferromagnetic layers 42, 46 can be switched by an external magnetic field. If the magnetisations are in a parallel orientation, it is more likely that electrons will tunnel through the insulating material used as the tunnel barrier layer 44 than if they are in an antiparallel orientation. The magnetisation of the ferromagnetic reference layer 42 is pinned in a reference direction, whilst the magnetisation of the ferromagnetic free layer 46 is free to change direction. As the magnetisation direction of the free layer 46 changes, the sensor will output will one of two states of electrical resistance (low resistance or high resistance), depending on whether the magnetisations of the two ferromagnetic layers 42, 46 are in a parallel or antiparallel orientation. FIG. 3B illustrates the change in resistance of a TMR-based multi-turn sensor as the free layer 46 changes direction with the rotation of an external magnetic field. When the magnetisation direction of the free layer 46 is antiparallel with that of the pinned reference layer 42, a high resistance is output. When the magnetisation direction of the free layer 46 is parallel with that of the pinned reference layer 42, a low resistance is output. When the magnetisation direction of the free layer 46 is perpendicular to that of the pinned reference layer 42, a medium resistance is output. Typically, to measure the change in resistance, electrical contacts on the top and bottom of the film 4 are needed in order to measure the current passing through the tunnel barrier layer 44.

Whilst the free layer 46 is shown in FIG. 3A as being one layer of ferromagnetic material, it will be appreciated that the free layer 46 may have other configurations. For example, the free layer 46 may have an alternating arrangement such as that described in US Patent Publication Number 2021-0372820, wherein at least a portion of the free layer comprises a plurality of layers of at least two different conductive materials, specifically, a plurality of layers of at least a first material that is ferromagnetic and a plurality of layers of at least a second material that is known not to exhibit an AMR effect and that does not interfere with the TMR effect of the layers of ferromagnetic material and the tunnel barrier layer 44. In this respect, the free layer 46 may comprises a thin layer of cobalt-iron-boron (CoFeB) that sits on top of the tunnel barrier layer 44, with the alternating arrangement sat on top of the CoFeB layer.

Figures 19A, 19B:
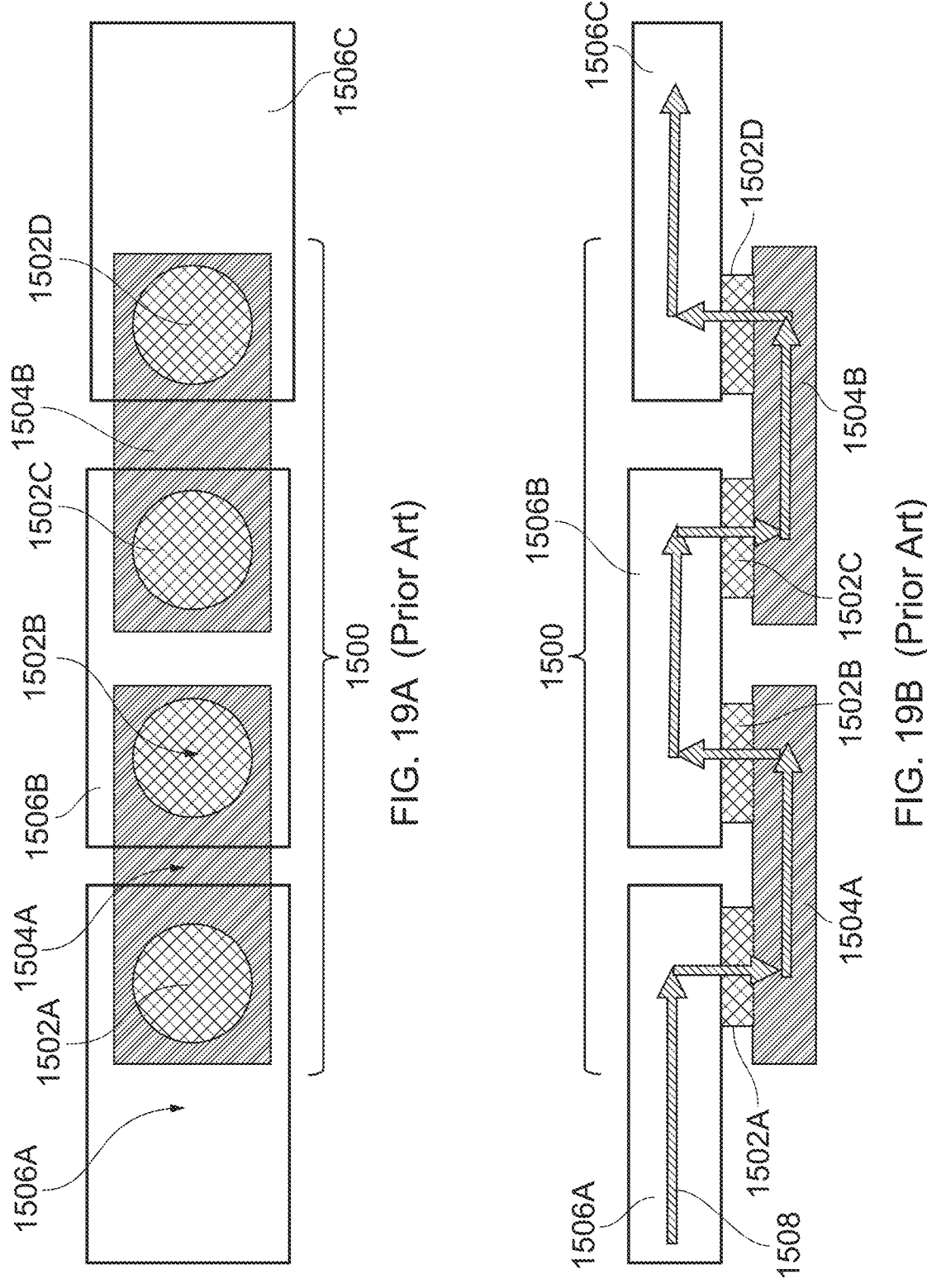
FIGS. 19A-B illustrate tunnel magnetoresistive resistor elements as known in the art.

In a typical TMR angle sensor, the TMR film is patterned to comprise TMR junctions having circular shapes, typically several μm in diameter. An example of a typical TMR resistor 1500 is illustrated by way of example in FIGS. 19A-B. Here, a chain of TMR sensor elements 1502A-D are connected to metal interconnects 1506A-C (such as tantalum, aluminium, copper or gold) and to each other via the bottom electrodes 1504A-B to form the TMR resistor 1500. A current (shown generally at 1508) is then passed through the chain of TMR sensor elements 1502A-D and the resistance measured therefrom.

Figure 20A:
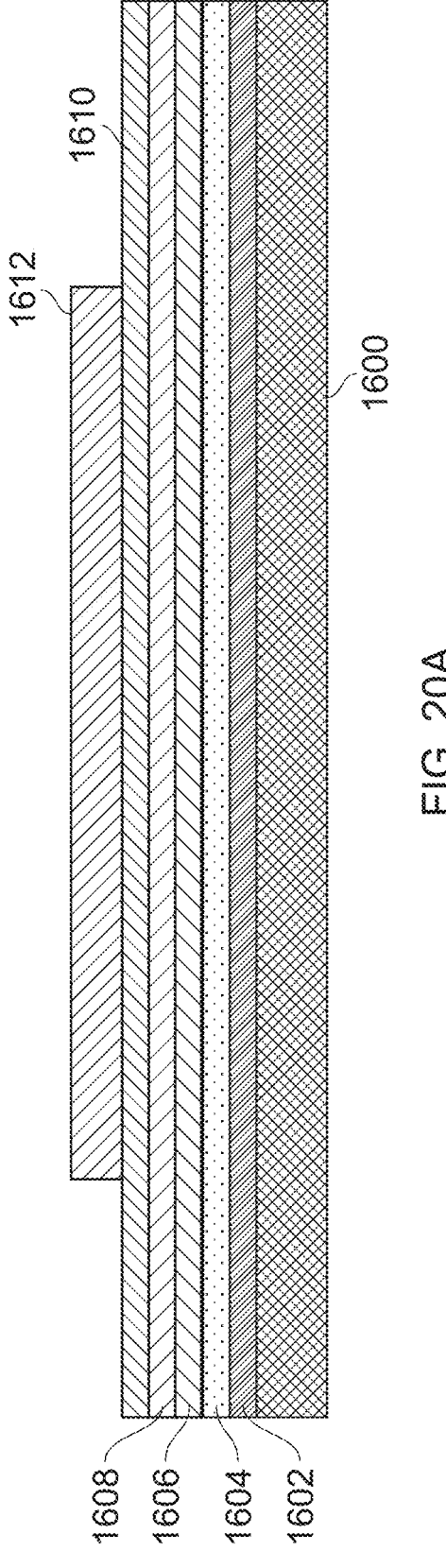
FIGS. 20A-j illustrates a typical method fabricating a tunnel magnetoresistive resistor elements.

FIGS. 20A-3 illustrate a typical process for fabricating a TMR sensor element (e.g., elements 1502A-D). FIG. 20A shows a basic TMR stack, comprising a substrate 1600 at the base (typically formed from silicon), followed by layer of intermetal dielectric (IMD) oxide 1602, such as silicon oxide, and a seed layer 1604 for promoting growth of the following layers by providing a smooth surface and a favourable crystal structure on which to grow. A bottom electrode 1606 is deposited onto the seed layer 1604, followed by the TMR film 1606 comprising the layers described with reference to FIG. 3. Finally, a capping layer 1610 is provided, typically a non-magnetic metal layer, which protects the stack and reduces diffusions when connecting to the metal interconnects.

Figure 20B:
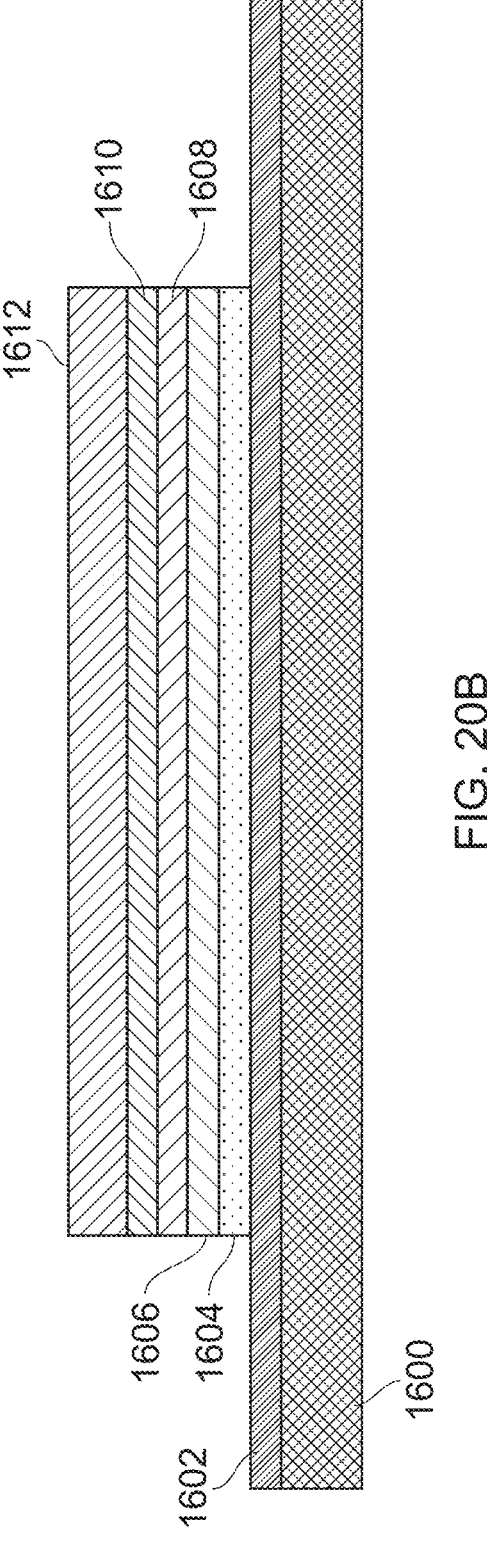

To begin the process, a photoresist 1612 is applied to the stack, which is then used to etch (e.g., using ion beam etching) through a portion of the capping layer 1610, the TMR film 1608, the bottom electrode 1606 and the seed layer 1604, as shown in FIG. 20B.

Figure 20C:
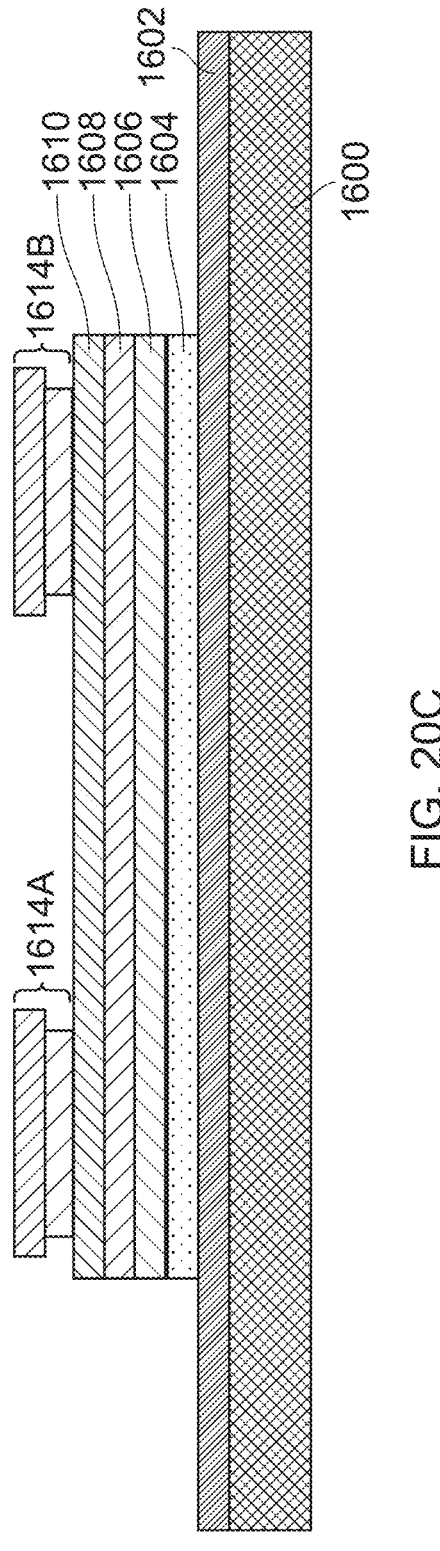
Figure 20D:
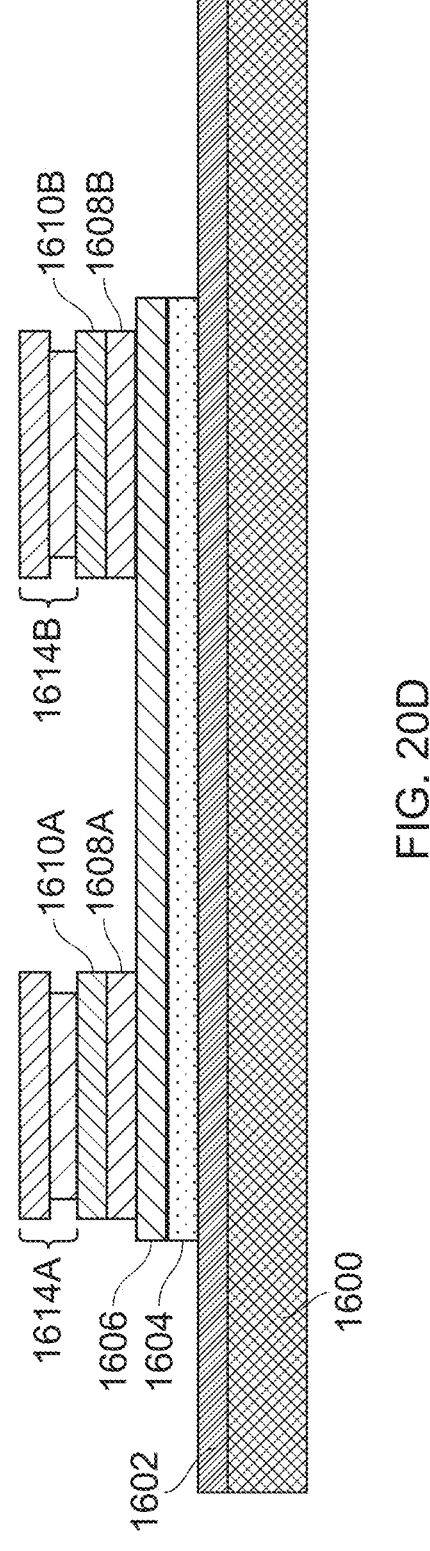

As shown in FIG. 20C, two TMR sensing elements are then formed by first applying a pair of lift-off resist bi-layers 1614A, 1614B, and etching through the capping layer 1610 and the TMR film 1608 only to leave two TMR junctions defined by portions 1608A-B, 1610A-B (e.g., corresponding to sensing elements 1502A-B in FIGS. 19A-B), as shown in FIG. 20D.

Figure 20E:
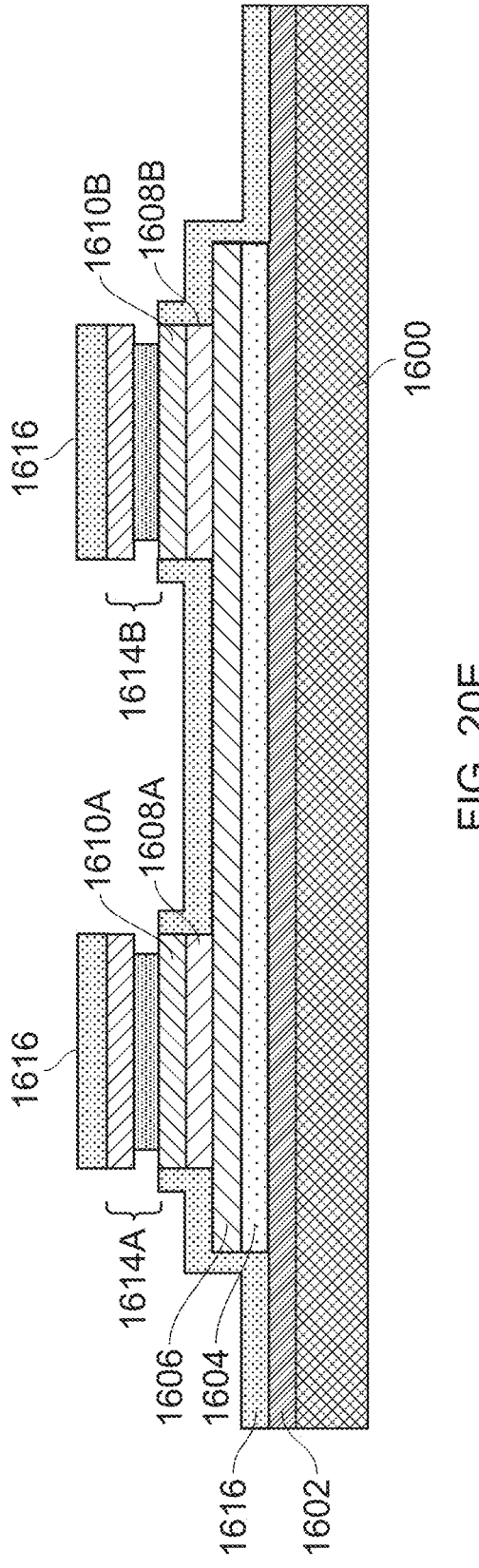
Figure 20F:
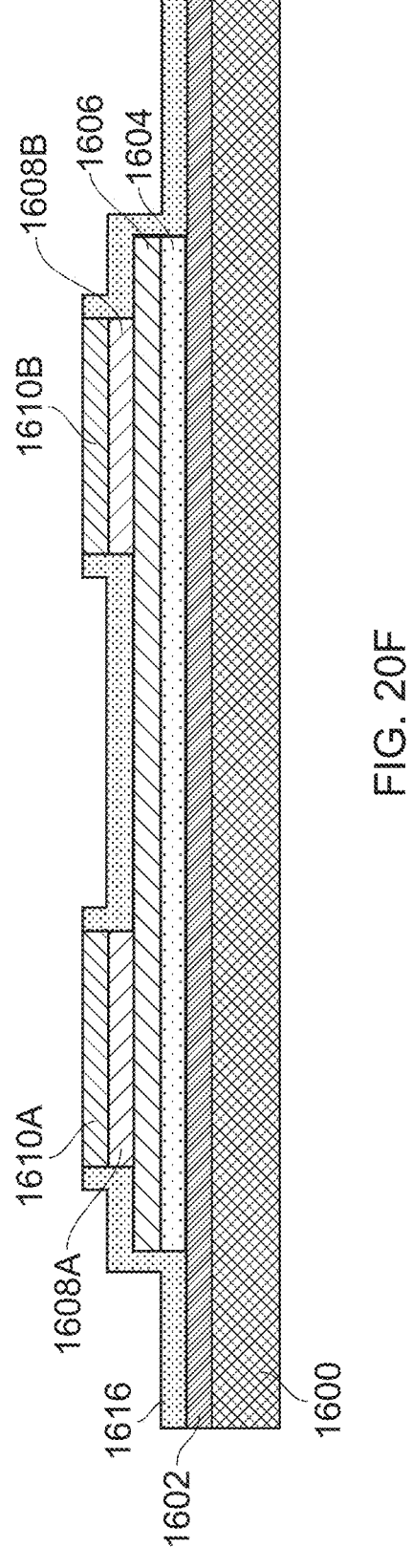

As shown in FIG. 20E, a layer of protective material 1616, such as aluminium oxide, is deposited over the stack (e.g., using sputtering techniques). This layer is necessary for isolation of the bottom electrode 1606 from the metal interconnects, and for protecting the sidewalls of the TMR junctions 1608A-B, 1610A-B from being short circuited by metallization. Here, the lift-off resist bi-layers 1614A, 1614B are left on during this process to protect the top surface of the capping layer 1610A-B. As shown in FIG. 20F, the lift-off resist bi-layers 1614A, 1614B are then dissolved to expose the top surface of the capping layer 1610A-B.

Figure 20G:
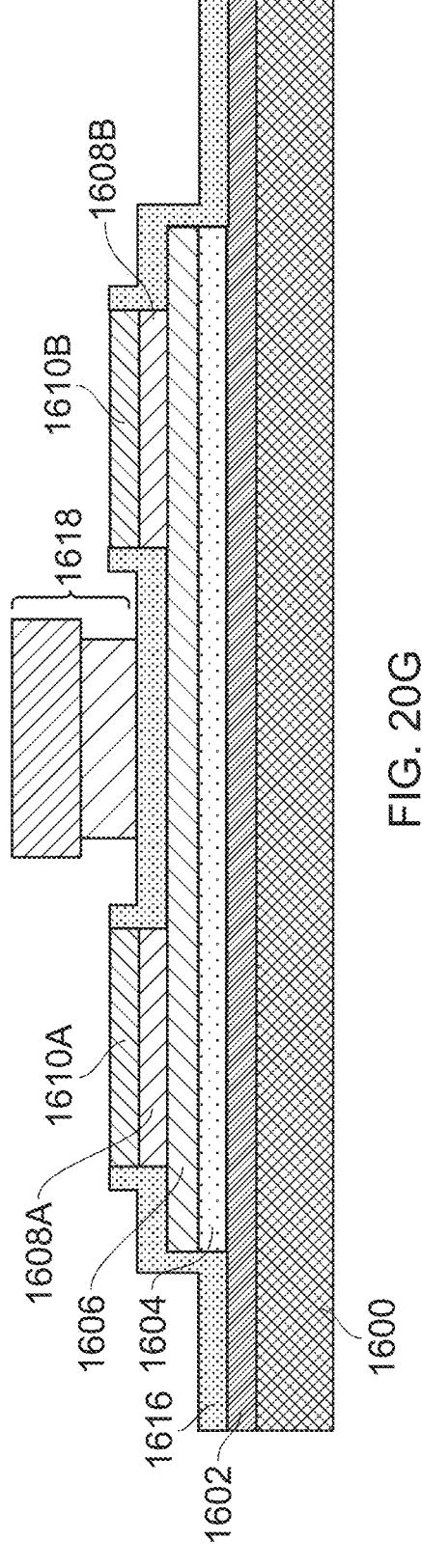
Figure 20H:
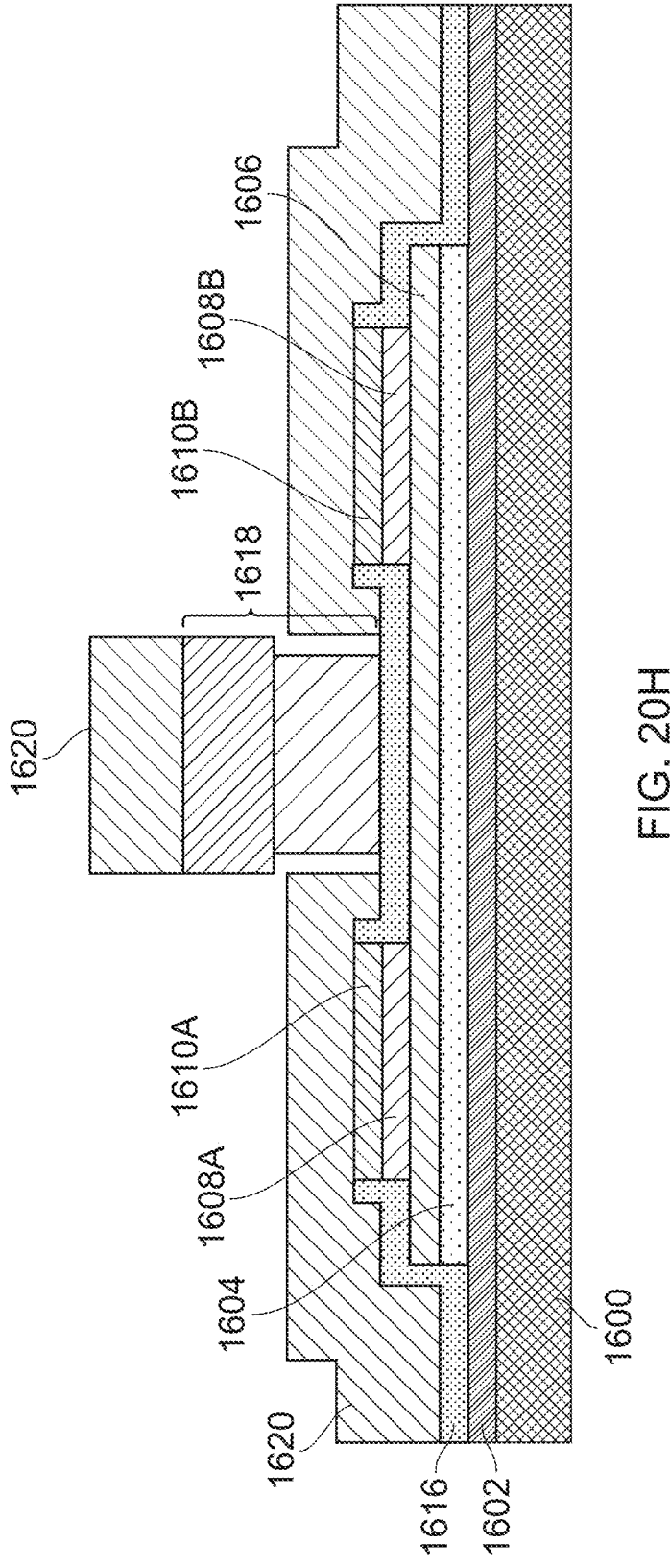
Figure 20I:
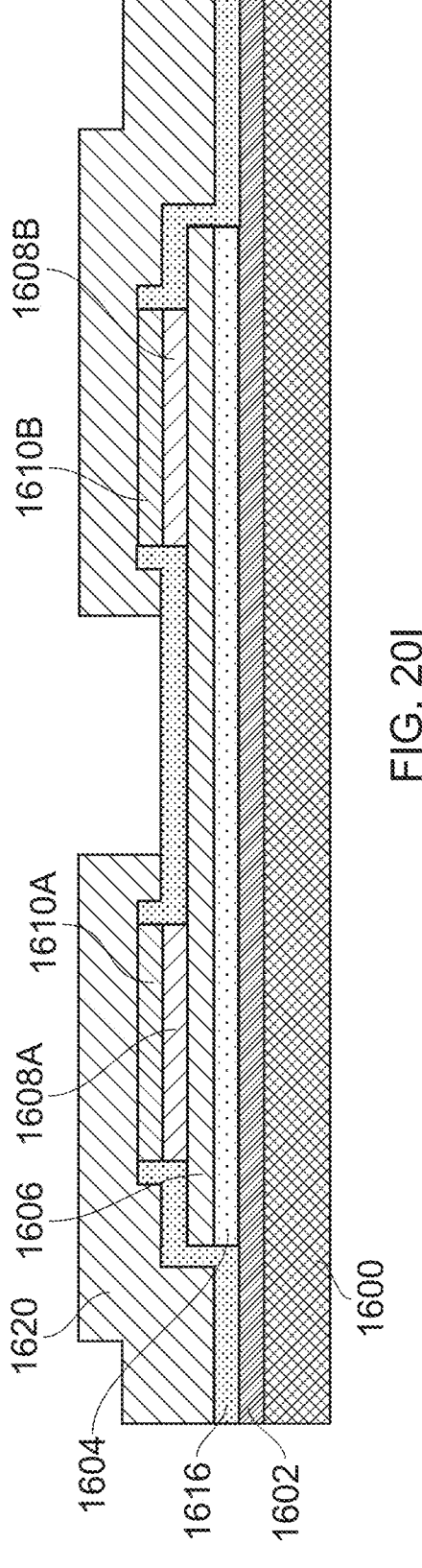
Figure 20J:
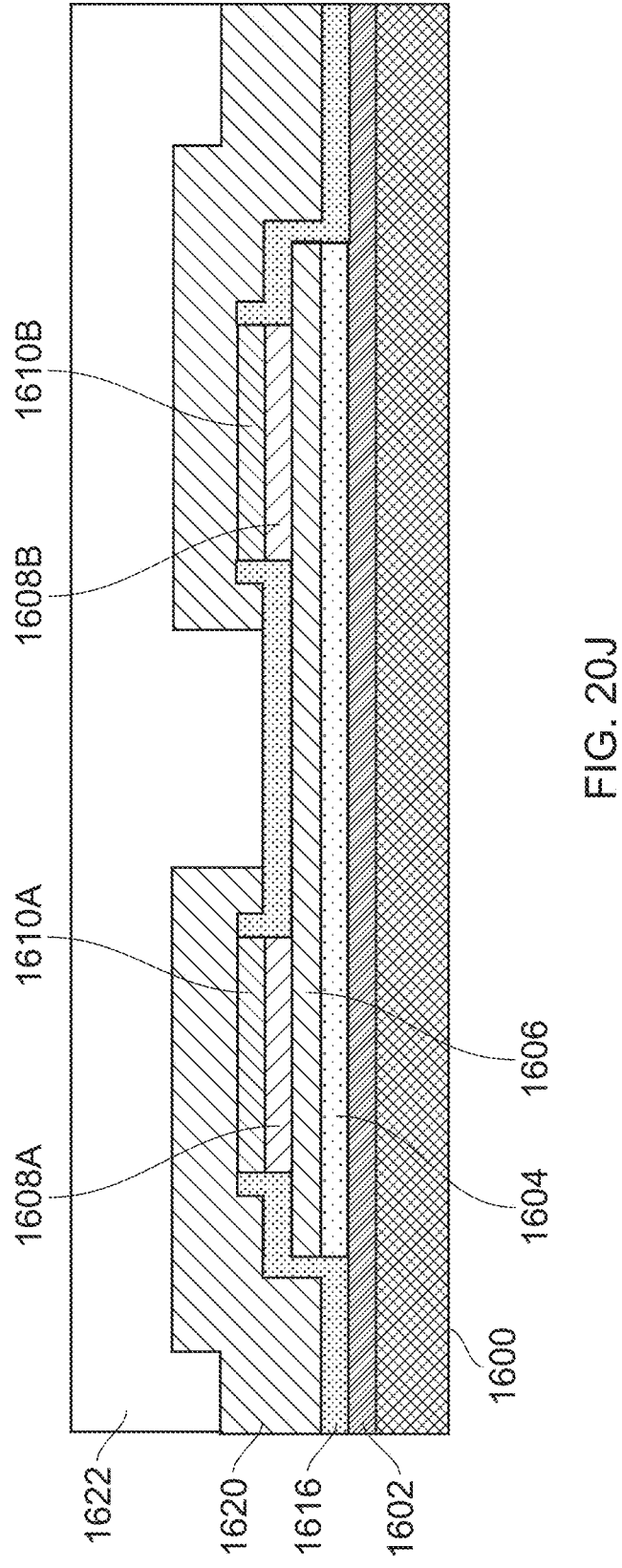

A further lift-off resist bi-layer 1618 is then applied between the TMR junctions 1608A-B, 1610A-B, as shown in FIG. 20G, and a metal layer 1620 (such as tantalum or gold) deposited over the stack, as shown in FIG. 20H, to thereby form metal interconnects. Once this has been done, the lift-off resist bi-layer 1618 is dissolved, as shown in FIG. 20I. Finally, a passivation layer 1622 for protecting the stack from moisture is deposited, as shown in FIG. 20J.

However, this self-aligned contact creation is only viable with a TMR element of the size of several μm due to the formation of the lift-off photoresist. Therefore, this is not suitable for very narrow TMR resistors, which are required for a TMR-based MT sensor.

Multi-turn devices based on TMR inherently have a higher (and thus detectable) change in resistance than devices based on GMR technology, and thus TMR based MT sensors can be implemented with shorter resistor lengths. The most challenging part of a TMR-based MT sensor is how to contact them and read-out the stored information, which is addressed in the present disclosure.

One known method for measuring tunnel magnetoresistance is current in-plane tunnelling (CIPT), which allows the TMR ratio (i.e., the relative change in sheet resistance, $R_S$, of the TMR film 4) to be measured through contacts on the same side of the TMR stack 4. In this respect, it will be appreciated that the TMR ratio is typically calculated as follows:

$$\frac{dR_s}{R_s} = \frac{R_{max} - R_{min}}{R_{min}} \times 100 \quad [1]$$

Figures 4A, 4B, 4C:
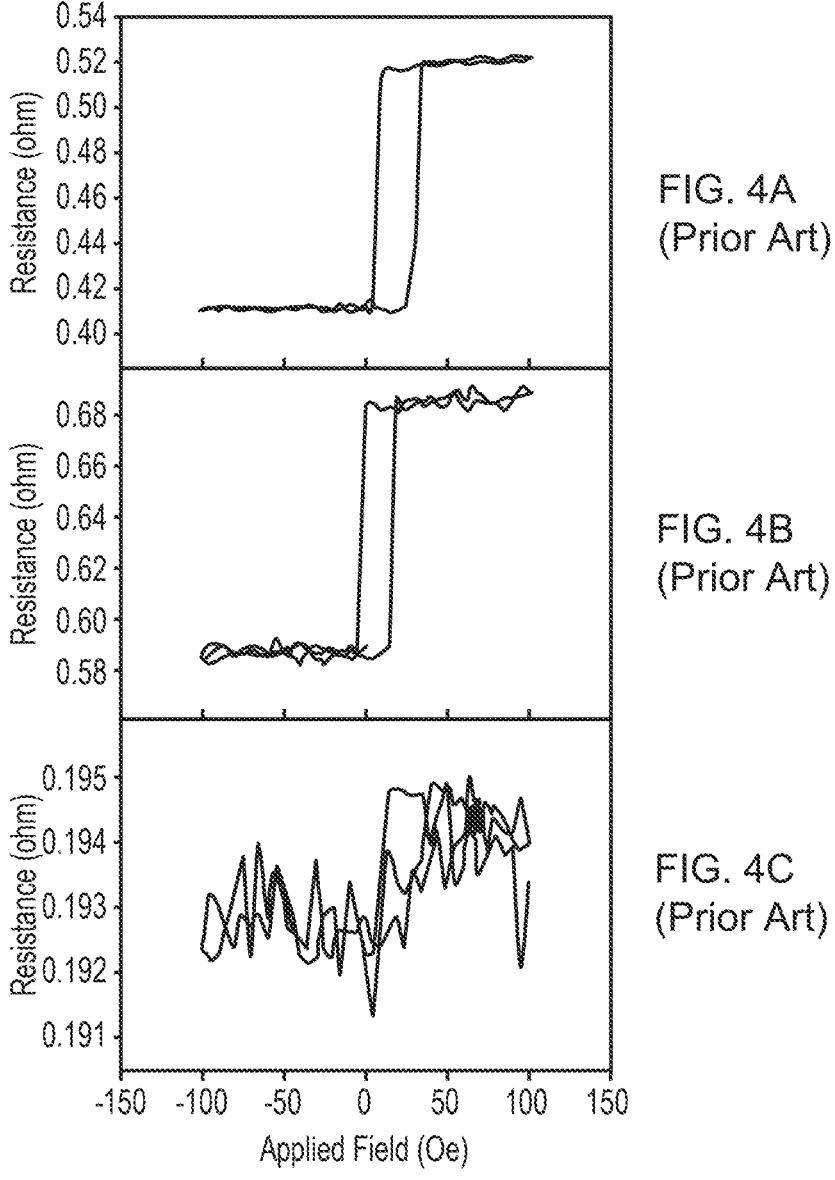
FIGS. 4A-C are graphs showing tunnelling magnetoresistance film measurements using a known method.

Consequently, there is no need for patterned contacts or access to a bottom electrode in order to pass a current perpendicular to the film plane. FIGS. 4A-C illustrate an example of CIPT measurements taken from a blanket TMR film using four probes at different spacings (Lee et al., *Current-in-plane Tunnelling Measurement through Patterned Contacts on Top Surfaces of Magnetic Tunnel Junctions*, Journal of Magnetics, 16(2), 169-172, 2011). FIG. 4A illustrates probes with relative spacings {1.5 mm, 1.5 mm, 1.5 mm}, FIG. 4B illustrates probes with relative spacings {9 mm, 3 mm, 3 mm}, and FIG. 4C illustrates probes with relative spacings {7.5 mm, 1.5 mm, 3 mm}. In this set of measurements, a smaller and equal spacing provides a clearer change in resistance with changing magnetic field, however, it will be appreciated that the optimal probe spacing will depend on a number of properties, such as the resistance of the free layer 46, the resistance of the bottom electrode and the resistance multiplied by area of the product (which itself will be a function of tunnel barrier thickness). Nevertheless, as illustrated by Table 1 below, measurements taken from patterned contacts on the surface of a blanket TMR film (i.e., the TMR film is not patterned in any way) can provide equivalent results as a commercial CIPT tool using needle contacts.

TABLE 1

| | | Sample 1 | Sample 2 |
|---|---|---|---|
| Resistance per Area (Ωμm²) | Patterned contacts | 13.65 | 15389 |
| | Commercial CIPT tool | 16.1 | 16.2 |
| MR Effect (%) | Patterned contacts | 120 | 43 |
| | Commercial CIPT tool | 122 | 51 |

Lee et al.

Figure 5A:
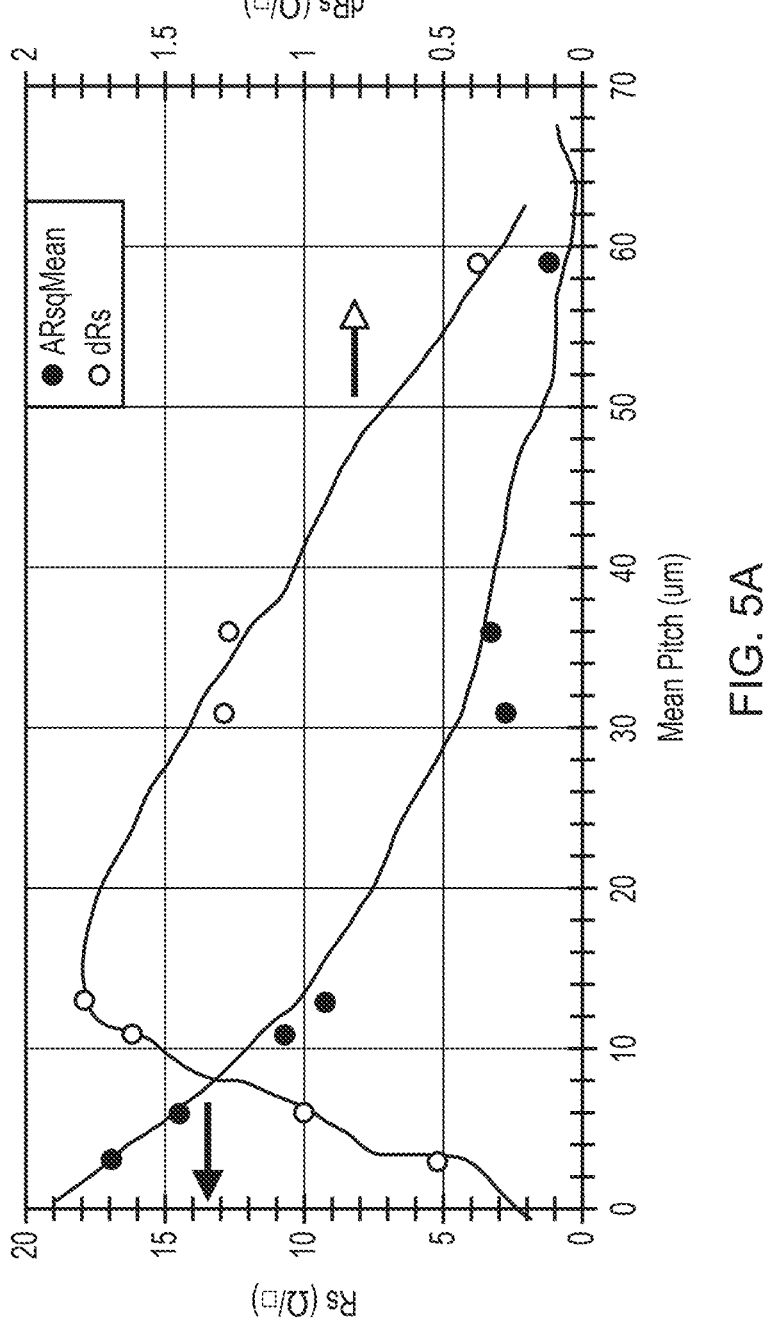
FIGS. 5A-B further illustrate tunnelling magnetoresistance film measurements using a known method.
Figure 5B:
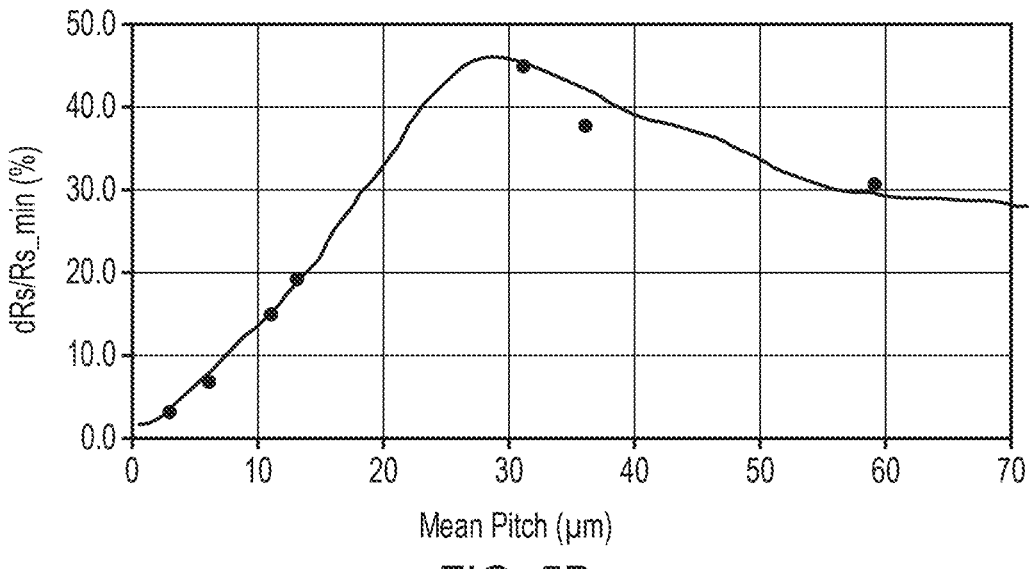

FIGS. 5A-B further illustrate the effect of spacing between contacts on CIPT measurements of a TMR film. FIG. 5A shows the sheet resistance ($R_S$) and the change in sheet resistance with changing magnetic field ($dR_S$) with changing electrode distance. FIG. 5B shows the relative change in sheet resistance ($dR_S/R_S$) calculated from the measurements in FIG. 5A. Although 31 μm mean pitch provides one of the lowest $R_S$ measurements, it provides the maximum $dR_S/R_S$ measurements, and so the final signal can be fine-tuned with electrode position and the overall resistance of the stack (in particular, the tunnel barrier layer) in mind. However, in some cases, it may be acceptable to obtain a low $dR_S/R_S$ but high resistance by going for low mean pitch. For example, in terms of the power consumption requirements, a smaller current is needed to measure a TMR resistor with a higher resistance (e.g., a 10 k Ohm resistor) compared to one having a resistance of many orders lower (e.g., a 10 Ohm resistor). If $dR_S/R_S$ on a 10 k Ohm resistor is 5%, it still has a measured change in resistance of 500 Ohm, whereas a 10 Ohm resistor with 50% $dR_S/R_S$ will provide a change of resistance of 5 Ohm only, which is much more difficult to measure.

Typically, CIPT method requires four or more contacts to be able to estimate the true TMR ratio (i.e., $dR_S/R_S$) of the film when current is passed through perpendicularly. However, for a TMR-based MT sensor, this may not be required and 2 or 3 may be sufficient to readout resistance changes, as will be described further below.

Examples of TMR-based MT sensors in accordance with the present disclosure will now be described. In a first set of examples, the TMR-based MT sensors make use of CIPT measurements to monitor changes in an external rotating magnetic field.

Figure 6A:
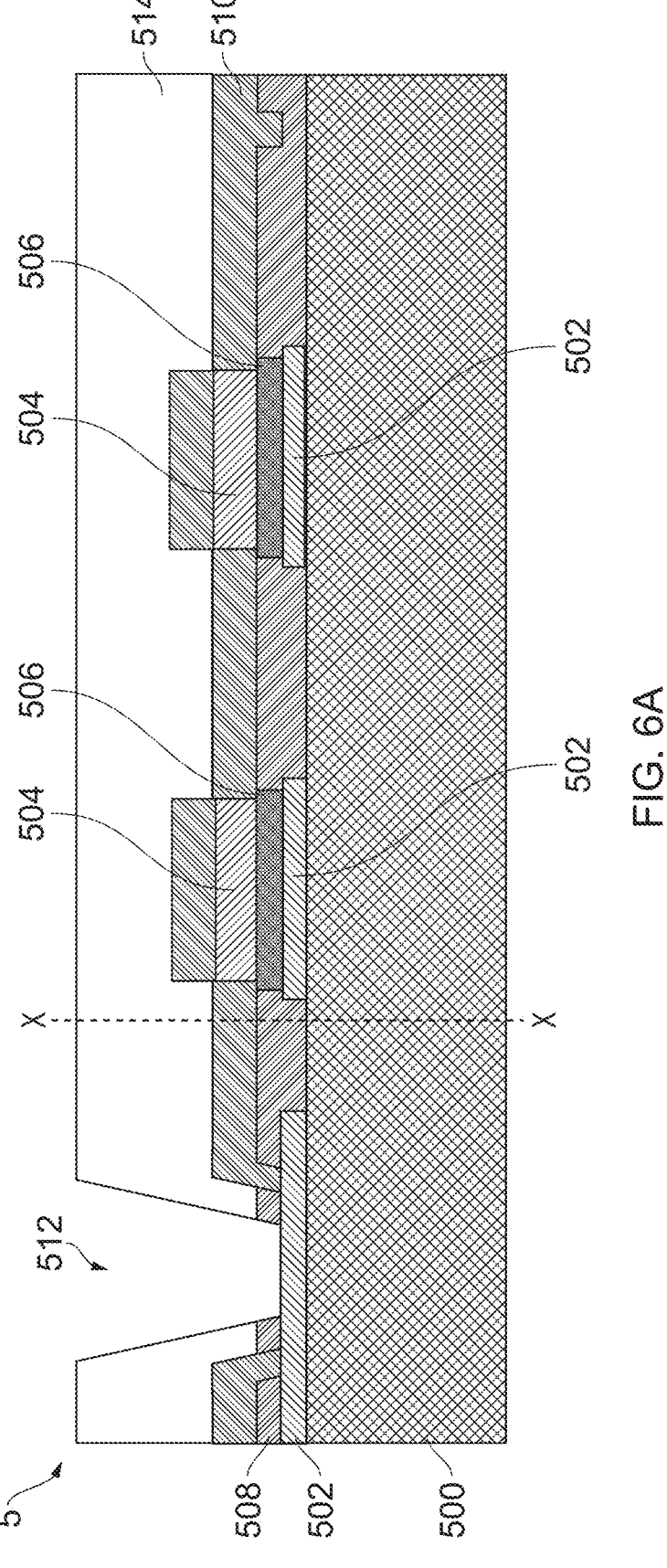
FIGS. 6A-B illustrate an example of a tunnel magnetoresistive multi-turn sensor in accordance with the present disclosure.
Figure 6B:
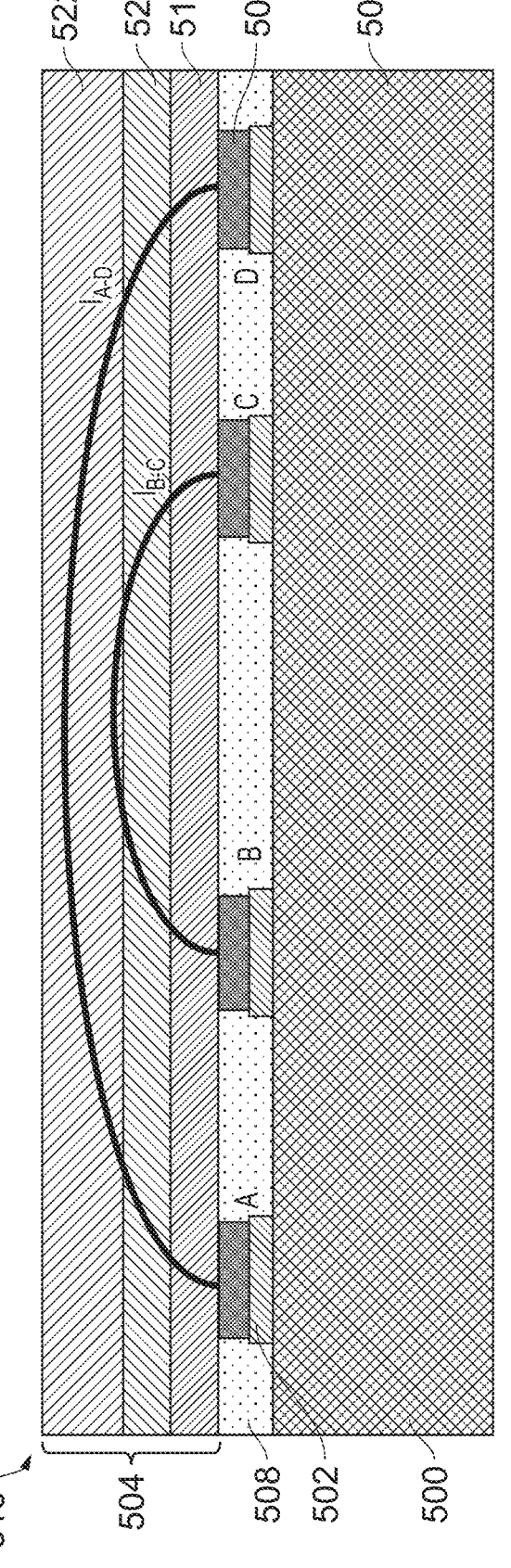

FIGS. 6A-B illustrate a first example of a TMR multi-turn sensor 5 in accordance with the present disclosure, wherein CIPT measurements are taken using electrical contacts below a TMR film 504 that is patterned into a multi-turn sensor spiral (such as that shown in FIG. 2). FIG. 6A shows a cross-sectional view of part of a TMR multi-sensor 5, comprising an application specific integrated circuit (ASIC) die 500 that is typically formed onto a laminate substrate such as a printed circuit board (PCB) substrate, ceramic substrate, or any suitable type of substrate. A metal layer 502 is deposited on to the ASIC die 500 for providing an electrical connection with the circuitry components, the top metal layer 502 being patterned (e.g., via lithography and etching) so as to provide connection points for a bond pad 503 and the TMR film 504, as will be described further below. The metal layer 502 may be formed from any suitable top metal material, such as aluminium, copper or stainless steel.

A layer of intermetal dielectric (IMD) oxide 508, such as silicon oxide, is disposed onto the ASIC die 500 and metal layer 502. When fabricating the sensor 5, a process of chemical-mechanical planarization may be performed at this stage in order to ensure the substrate is smooth and planarized. A plurality of vias 506 are then formed in the IMD oxide 508 in the region of each metal layer 502. The vias 506 may be formed by a process of lithography and etching, each etched via being filled (e.g., via deposition) with a plug made from any suitable material, such as tungsten. The thickness of the vias 506 is preferably very small (~0.3-0.4 μm), whilst the width is substantially the same as the width of the TMR film 504 once it has been patterned into a spiral configuration. In this respect, the width of the patterned TMR film 504 is typically in the range of 200 nm to 1000 nm, and preferably, around 350 nm. Whilst it is preferable that the vias 506 align well with the TMR film 504, the vias may be slightly smaller or larger in width provided that the vias 506 directly contact the TMR film 504. At this stage, a further process of chemical-mechanical planarization is performed as it is important that the top surface of the tungsten plug vias 506 are completely smooth and planarized. If the top surface of the tungsten plug vias 506 is not smooth, this can result in protrusions in the TMR film 504 deposited thereon. In use, such defects may prevent magnetic domain walls from propagating along the sensor spiral as an external magnetic field rotates, which is required in order to track the number of turns, and thereby cause errors in the sensor output.

A blanket TMR film 504 is then deposited and undergoes magnetic annealing in order to set the magnetisation directions of the reference layer in the TMR film 504. It will however be appreciated that the magnetic annealing process may be performed at a later stage. As noted above, a thin layer of metal (not shown) may be provided as a starting material for the TMR film 504 to provide a bottom electrode that can form an electrical connection with the vias 506. The TMR film 504 will be patterned (e.g., via lithography) to form an open or closed loop spiral configuration, such as those shown in FIGS. 1A-B and 2. In this respect, the TMR film 504 is patterned so that the tracks of the spiral are formed directly over and aligned with the vias 506, such that the vias 506 provide an electrical connection between the TMR film 504 and the metal layer 502, and such that the width of the TMR film 504 is substantially the same as the vias 506. Preferably, the thickness of the tracks of TMR film is approximately 350 nm.

A protective layer 510 is then deposited over the substrate, which may be formed of any suitable material, such as aluminium oxide. A portion of the protective layer 510 and the IMD oxide 508 will then be etched in order to provide a bond pad opening 512. Finally, a passivation layer 514, for example, a silicon nitride layer, is deposited and then etched in the region of the bond pad opening 512, to thereby mechanically protect the sensor 5 from moisture. In this example, the passivation layer 514 is shown as a single layer of material, however, it will be appreciated that the passivation layer 514 may also be formed of multiple layers of different materials, for example, inorganic materials such as silicon nitride, silicon oxide or aluminium oxide, or organic polymer materials such as Polyimide, benzocyclobutene (BCB) or SU-8.

FIG. 6B shows a cross-sectional view of the sensor 5, along the axis X shown in FIG. 5A, wherein the portion of the TMR film 504 shown corresponds to a single sensing element 516 with the sensor spiral. As can be seen, the sensing element 516 comprises four bottom electrical contacts A, B, C and D, each formed by a metal layer 502 and a via 506. As before, the TMR film 504 comprises an antiferromagnetic pinning layer and a ferromagnetic reference layer (shown here as a single layer 518), a tunnel barrier layer 520 and a ferromagnetic free layer 522. Again, as noted previously, the TMR film 504 will be typically provided with a thin layer of metal (not shown) as a bottom layer, to provide the electrical contact with the vias 506.

In use, as an external magnetic field is applied, the current passing through the tunnel barrier layer 520 is measured by measuring the current difference between electrical contacts A and D, and B and C, respectively, from which the change in resistance is measured. A larger portion of the current flowing between electrical contacts A and D (denoted by line $I_{A-D}$) passes through the free layer 522 than the current flowing between electrical contacts B and C (denoted by line $I_{B-C}$). In this respect, when the contacts are placed very close together, the current will not tunnel all of the way through the TMR film 504 and will mainly flow through the bottom electrode. When the contacts are very widely spaced, the current will divide proportionally between the top and bottom electrode. Therefore, less current will tunnel through the tunnel barrier layer 520 for smaller contact spacing, whereas more current will tunnel through at larger spacing since it will form less of a resistive path, thus providing a more observable change in resistance due to the TMR effect. As such, only electrical contacts A and D are necessary for measuring the TMR effect, however, the electrical contacts B and C may be implemented in order to provide a reference measurement. Therefore, it will be appreciated that only two electrical contacts per sensing element 516 may be required to provide the sensor read-out.

Figure 7:
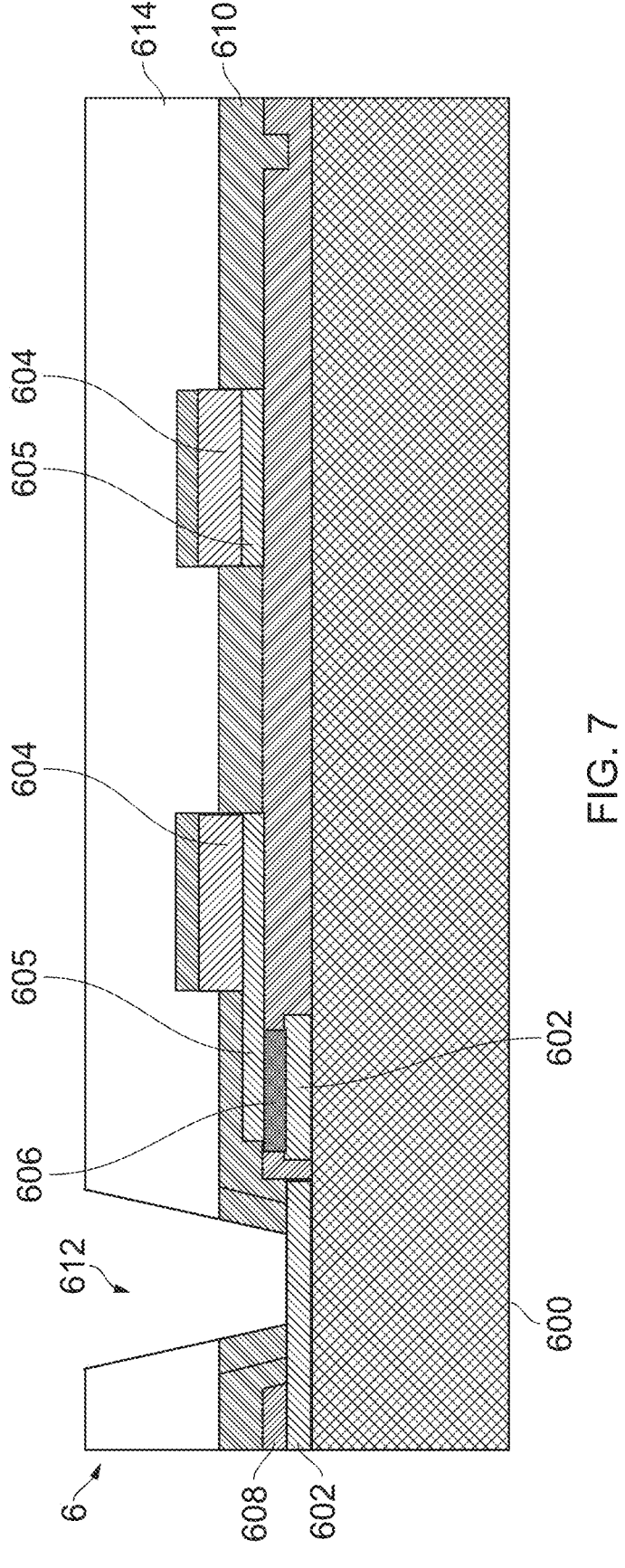
FIG. 7 illustrates a further example of a tunnel magnetoresistive multi-turn sensor in accordance with the present disclosure.

FIG. 7 illustrates a further example of a TMR multi-turn sensor 6 in accordance with the present disclosure, wherein CIPT measurements are again taken using electrical contacts positioned below a TMR film 604 that is patterned into a multi-turn sensor spiral. The overall structure of the sensor 6 is similar to that described with respect to FIGS. 6A-B, however, in this example, each via 606 and the metal layer 602 on which it is disposed are offset from the patterned TMR film 604, and the TMR film 604 is formed so that a further metal layer 605 is formed under the TMR film 604 and extends to a via 606. In doing so, it is not necessary to directly align the vias 606 with the patterned TMR film 604, and the risk of defects caused by irregularities in the topography of the vias 606 can be reduced.

Figure 8A:
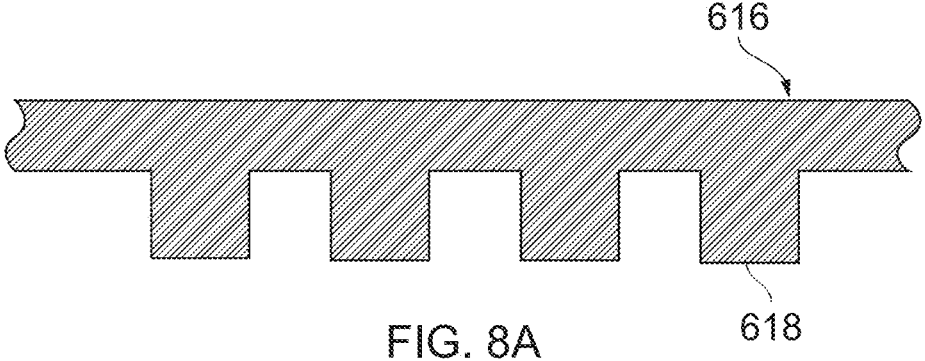
FIGS. 8A-B illustrate a part of the fabrication of the tunnel magnetoresistive multi-turn sensor shown in FIG. 7.
Figure 8B:
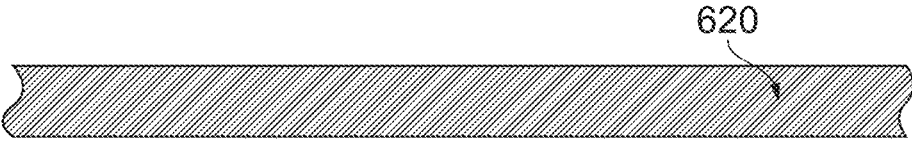
Figure 9:
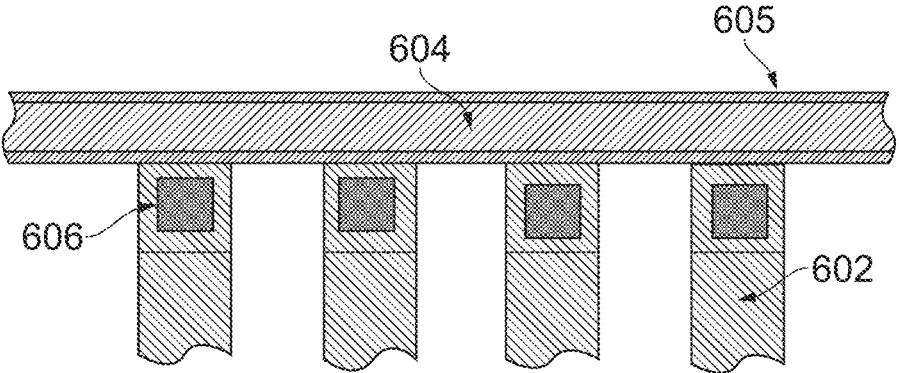
FIG. 9 further illustrates a part of the tunnel magnetoresistive multi-turn sensor shown in FIG. 7.

An example of how the TMR film 604 may be fabricated is illustrated by FIGS. 8A-B and 9. As will be appreciated, the ASIC die 600, first metal layer 602, vias 506 and IMD oxide layer 608 may be fabricated using the same method described above with respect to FIGS. 6A-B. The blanket TMR film 604 is then similarly deposited, and undergoes magnetic annealing to set the magnetisation directions of the ferromagnetic reference layer and ferromagnetic free layer. A two-step patterning process is then performed. In the first step, as shown by FIG. 8A, a first mask 616 may be applied to etch a first pattern in the entire TMR film 604 comprising a plurality of protrusions 618 that are formed over the vias 606. As shown in FIG. 8B, a second mask 620 is then used to etch the TMR resistor tracks that will form the MT sensor spiral. In the regions of the protrusions 618, everything will be removed expect the bottom layer of metal 605. The resulting configuration is illustrated by FIG. 9, from which portions of the bottom layer of metal 605 extend out from the TMR film 604 over the top of the vias 606, thereby providing a chain of electrical contacts. The rest of the sensor 6 (i.e., the protective layers 610, 614 and the bond pad opening 612) may then be fabricated in substantially the same way as that described with reference to FIGS. 6A-B.

Figure 10A:
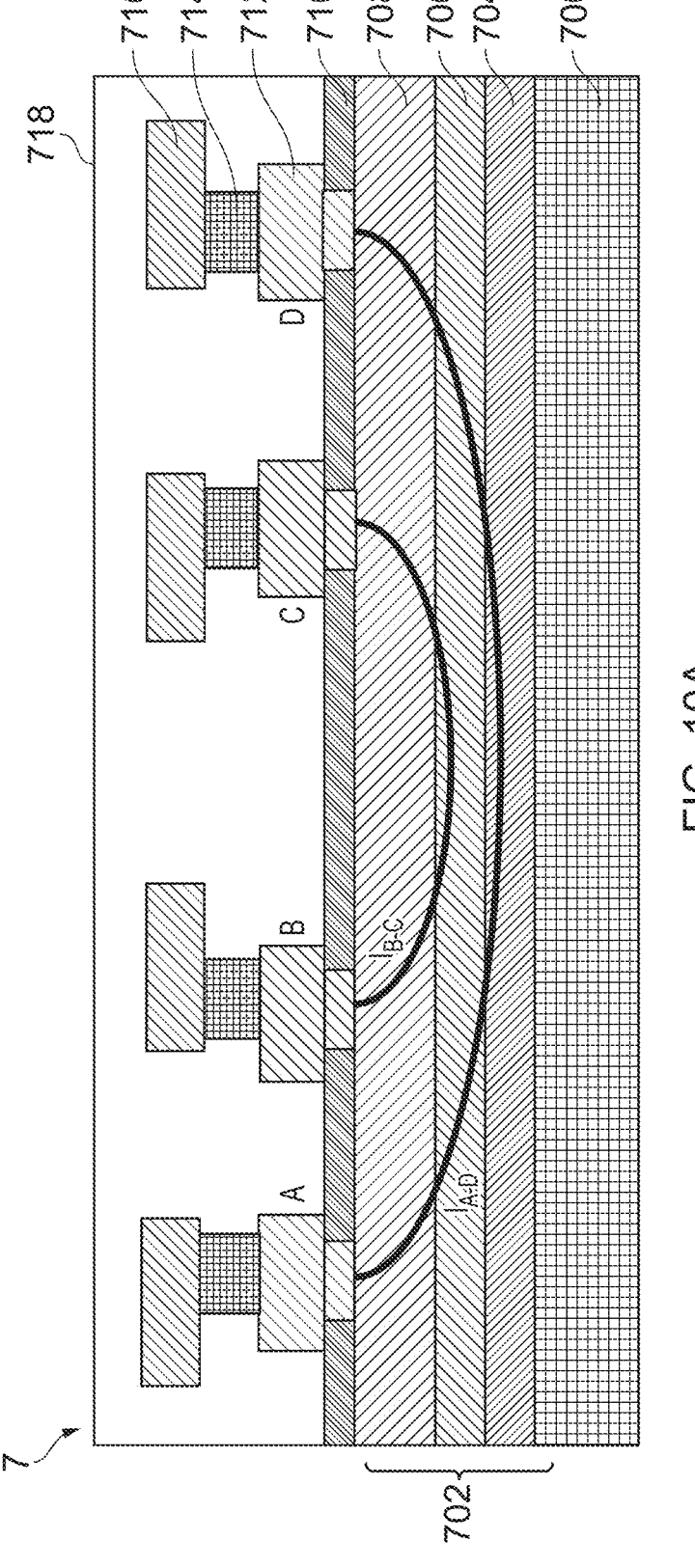
FIGS. 10A-B illustrate another example of a tunnel magnetoresistive multi-turn sensor in accordance with the present disclosure.
Figure 10B:
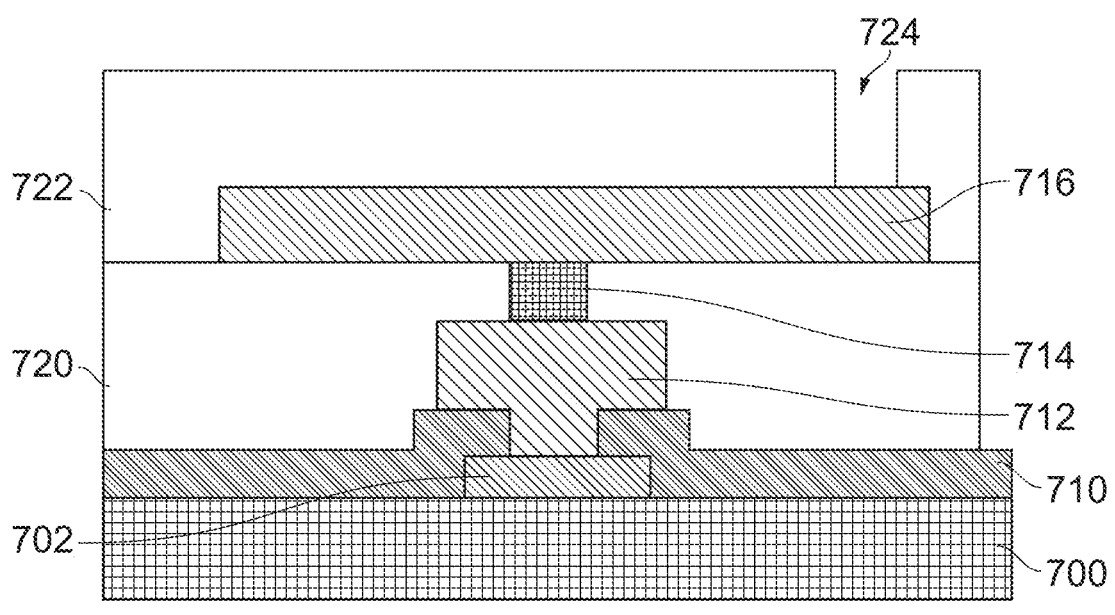

FIGS. 10A-B illustrate a further example of a TMR multi-turn sensor in accordance with the present disclosure, wherein CIPT measurements are taken using electrical contacts positioned above a TMR film that is patterned into a multi-turn sensor spiral. FIG. 10A shows a cross-sectional view of one sensing element 7 of the TMR multi-sensor, comprising an application specific integrated circuit (ASIC) die 700 that is typically formed onto a laminate substrate such as a printed circuit board (PCB) substrate, ceramic substrate, or any suitable type of substrate. A blanket TMR film 702 will then be deposited onto the ASIC die 700 and undergoes magnetic annealing in order to set the magnetisation directions of the reference layer and the free layer in the TMR film 702. The TMR film 702 will be patterned (e.g., via lithography) to form an open or closed loop spiral configuration, such as those shown in FIGS. 1A-B and 2. As before, the TMR film 702 comprises an antiferromagnetic pinning layer and a ferromagnetic reference layer (shown here as a single layer 704), a tunnel barrier layer 706 and a ferromagnetic free layer 70. Likewise, the TMR film 702 will be provided with a bottom and top layer of metal (not shown) for electrically connecting the TMR film 702.

A protective layer 710 is then deposited over the substrate, which may be formed of any suitable material, such as aluminium oxide. A plurality of openings in the protective layer 710 are then provided (e.g., by lithography and etching), and a metal capping layer 712 deposited into the openings to contact the TMR film 702. In this respect, it is important that the openings are narrower than the width of the TMR film 702 to ensure that the metal capping layer 712 does not touch the side walls of the TMR film 702, which could result in the sensor short circuiting.

As shown in more detail in FIG. 1013, which shows a side view of the sensing element 7, an IMD layer 720, such as silicon nitride, is then deposited onto the substrate, which will form part of the protective layer shown more generally as 718 in FIG. 10A. A plurality of vias 714 are then formed in the IMD layer 720 in the region of each metal capping layer 712 (e.g., by lithography and etching) and filled (e.g., via deposition) with a plug made from any suitable material, such as tungsten. At this stage, a process of chemical-mechanical planarization may be performed to ensure a smooth top surface. A further layer of metal 716 is then be deposited for electrically connecting the vias 714 to the sensor circuitry (not shown). Finally, a passivation layer 722, for example, a silicon nitride layer, is deposited and etched to form a bond pad opening 724.

In use, as an external magnetic field is applied, the current passing through the tunnel barrier layer 706 is measured by measuring the current difference between electrical contacts A and D, and B and C, respectively, from which the change in resistance is measured. A larger portion of the current flowing between electrical contacts A and D (denoted by line $I_{A-D}$) passes through the free layer 522 than the current flowing between electrical contacts B and C (denoted by line $I_{B-C}$). As such, only electrical contacts A and D are necessary for measuring the TMR effect, however, the electrical contacts B and C may be implemented in order to provide a reference measurement. Therefore, it will be appreciated that only two electrical contacts per sensing element 7 may be required to provide the sensor read-out.

Figure 11A:
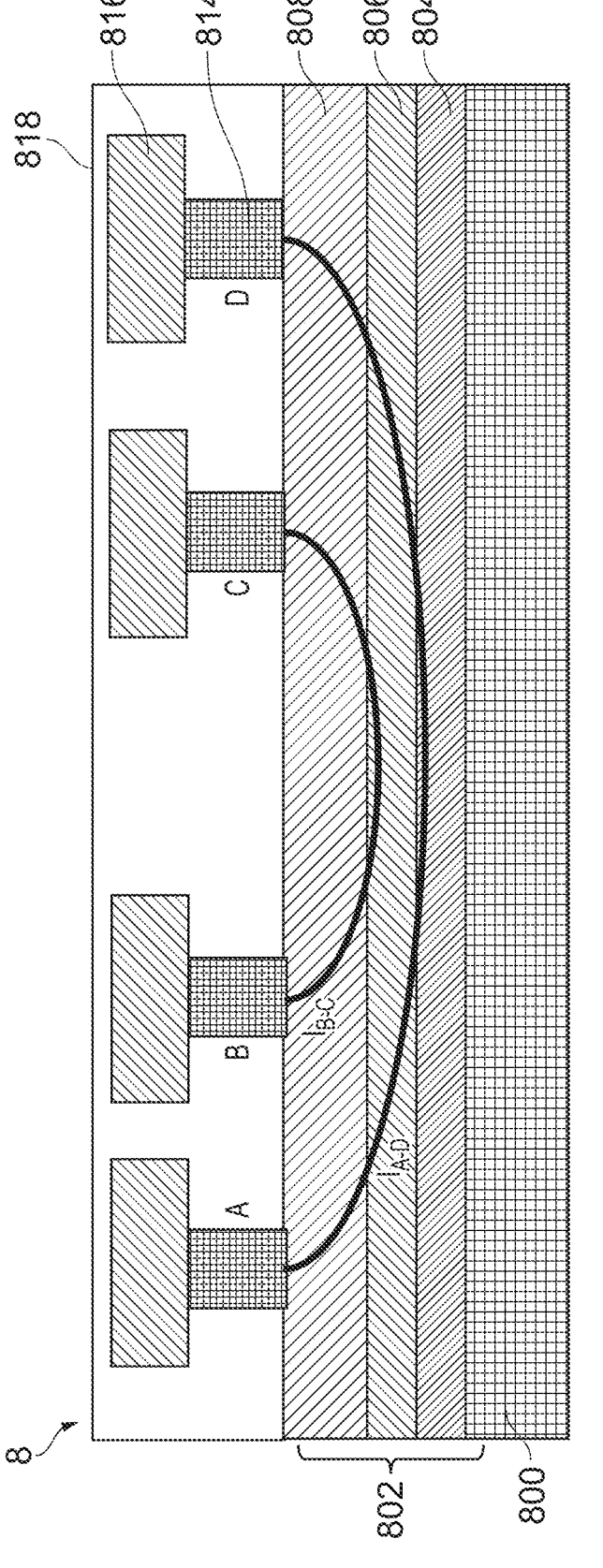
FIGS. 11A-B illustrate a further example of a tunnel magnetoresistive multi-turn sensor in accordance with the present disclosure.
Figure 11B:
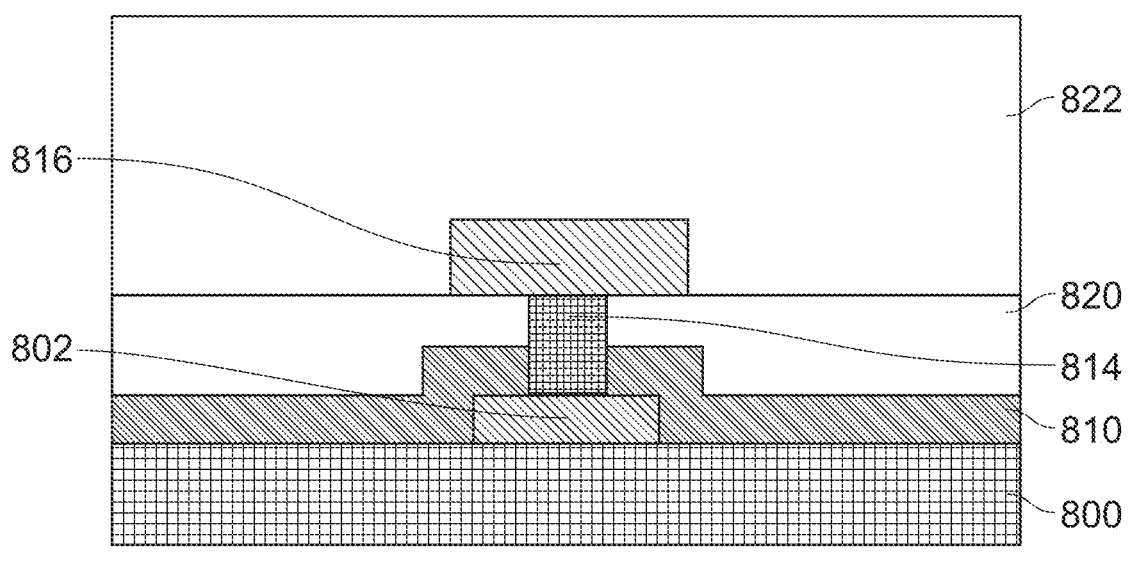

FIGS. 11A-B illustrate a further example of a TMR multi-turn sensor in accordance with the present disclosure, wherein CIPT measurements are taken using electrical contacts positioned above a TMR film that is patterned into a multi-turn sensor spiral. The overall structure of the sensor is similar to that described with reference to FIGS. 10A-B, however, in this example, each via 814 is formed in the protective layers 810, 820 such that the vias 814 contact the TMR film 802 directly.

Figure 12:
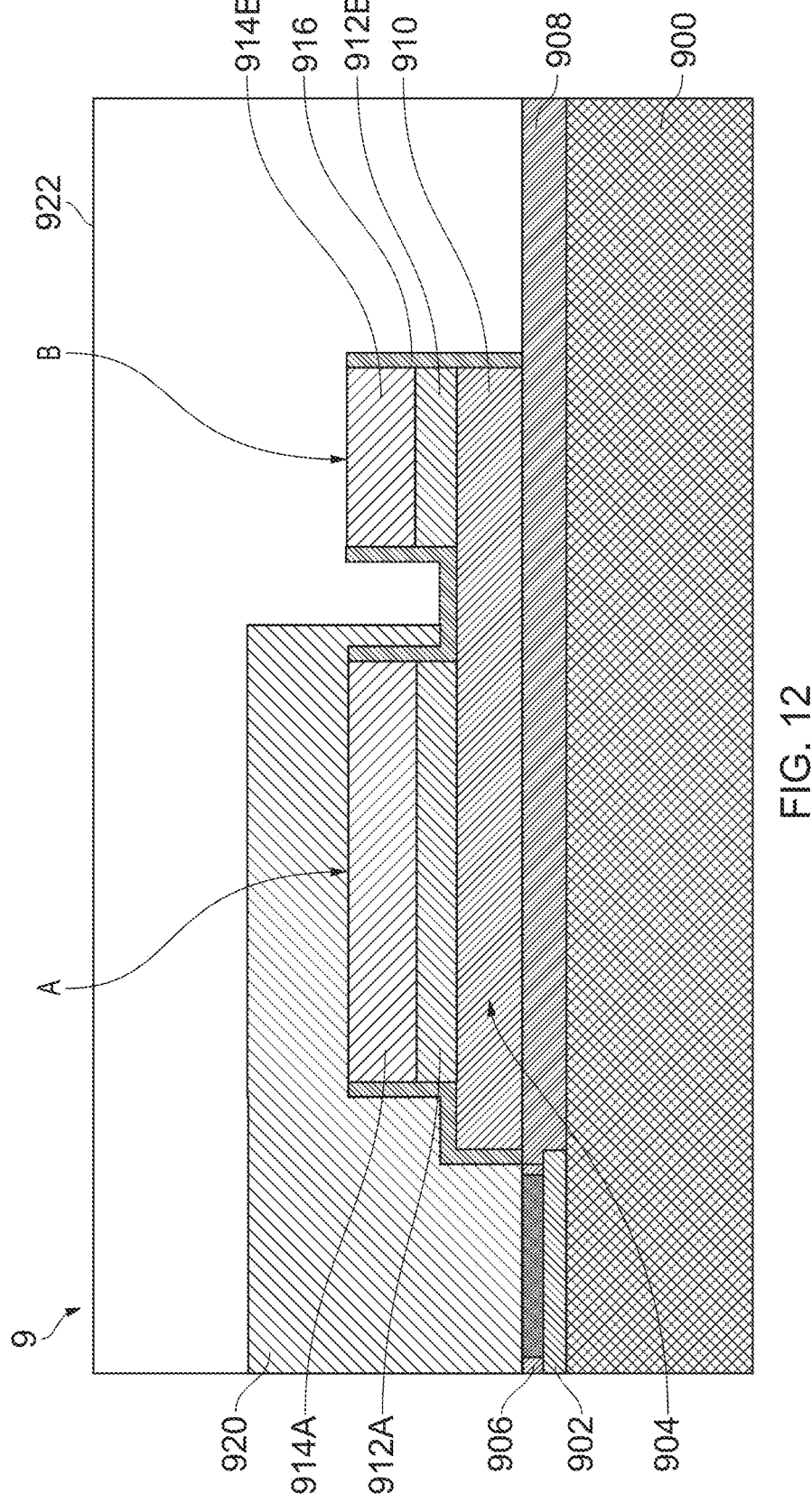
FIG. 12 illustrates a further example of a tunnel magnetoresistive multi-turn sensor in accordance with the present disclosure.

FIG. 12 illustrates a further example of a TMR multi-turn sensor in accordance with the present disclosure, wherein CIPT measurements are taken using electrical contacts positioned above a TMR film that is patterned into a multi-turn sensor spiral. FIG. 12 shows a cross-sectional view of one sensing element 9 of the TMR multi-sensor, comprising an application specific integrated circuit (ASIC) die 900 that is typically formed onto a laminate substrate such as a printed circuit board (PCB) substrate, ceramic substrate, or any suitable type of substrate. A metal layer is deposited on to the ASIC die 900 for providing an electrical connection with the circuitry components, the top metal layer 902 being patterned (e.g., via lithography and etching) so as to provide connection points for a further metal layer 920, as will be described further below. The first metal layer 902 may be formed from any suitable top metal material, such as aluminium, copper or stainless steel.

A layer of intermetal dielectric (IMD) oxide 908, such as silicon oxide, is disposed onto the ASIC die 900 and metal layer 902. A plurality of vias 906 are then formed in the IMD oxide 904 in the region of each metal layer contact 902. At this stage, a process of chemical-mechanical planarization may be performed to ensure the top surface of the substrate is completely smooth and planarized. A blanket TMR film 904 can then be deposited, the TMR film undergoing magnetic annealing in order to set the magnetisation directions of the reference layer and the free layer in the TMR film 904. As before, the TMR film 904 comprises an antiferromagnetic pinning layer and a ferromagnetic reference layer (shown here as a single layer 910), a tunnel barrier layer 912A, 912B and a ferromagnetic free layer 914A, 914B. In this example, the tunnel barrier layer 912A, 912B and the ferromagnetic free layer 914A, 914B of the TMR film 908 are etched so as to form two portions, a first portion comprising a plurality of read-out pillars (shown generally by "A"), and a second portion comprising the tracks of the sensor spiral (shown generally by "B"). As previously, a thin layer of metal (not shown) may be provided as a starting material for the TMR film 904 to provide a bottom electrode, which in this case will electrically connect the read-out pillars (i.e., portion A) and the tracks of the sensor spiral (i.e., portion B). The exposed surface area of the read-out pillars is substantially larger than the exposed surface area of the tracks of the sensor spiral. For example, the read-out pillars may have a width of more than 3 μm, whilst the tracks of the sensor spiral may be in the region of 350 nm. The reason for this is so that the resistance in the read-out pillars is significantly lower, such that the change in resistance is near-negligible relative to the resistance change in the tracks of the sensor spiral.

For example, the TMR film 904 may have a 50% TMR ratio or dR/R effect. The mean resistance of each read-out pillar A may be 125 Ohm, which changes between 100-150 Ohm due to TMR effect. The much smaller area of each sensor track B may then provide a mean resistance of 1250 Ohm, which changes between two values, 1073 and 1426 Ohm, due to the TMR effect. In this respect, the resistance is not changing by the full 50% because the magnetization of the pinned layer 910 is orientated 45° relative to the longitudinal axis of the sensor track B. When the sensor track B is in a low state of resistance, the measured resistance of both the read-out pillar A and the sensor track B (as measured from the read-out pillar A) will be between 1173 Ohm (1073+100) and 1223 Ohm (1073+150). When the sensor track B is in high state of resistance, the measured resistance of both the read-out pillar A and the sensor track B (as measured from the read-out pillar A) will be between 1526 Ohm (1426+100) and 1576 Ohm (1426+150). Consequently, there is a large gap between the observed low state of resistance and high state of resistance of this leg of the sensor spiral, independent of the magnetization of the read-out pillar A and its parasitic signal.

A protective layer 916 is then deposited over the substrate, which may be formed of any suitable material, such as aluminium oxide, and etched to expose the top surface of the TMR film 904. A further metal layer 920 is then formed over the first portion A (i.e., the read-out pillars) to thereby provide an electrical connection with vias 906 and the metal contacts 902 and thus provide a CIPT. Finally, a passivation layer 922, for example, a silicon nitride layer, is deposited over the entire structure.

Figure 13A:
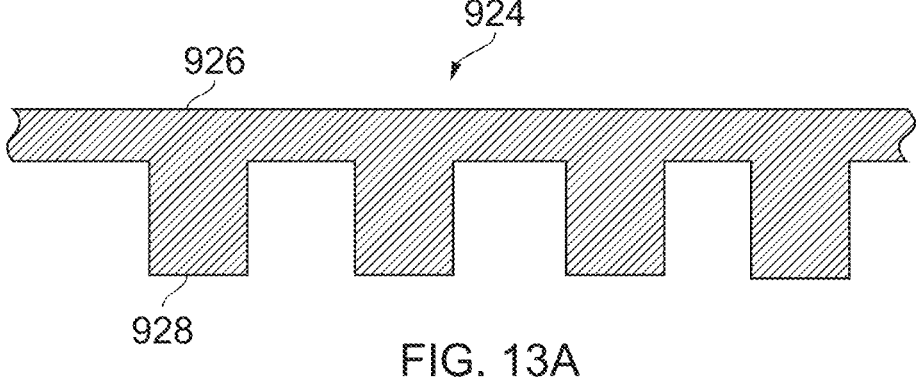
FIGS. 13A-C illustrate a part of the fabrication of the tunnel magnetoresistive multi-turn sensor shown in FIG. 12.
Figure 13B:
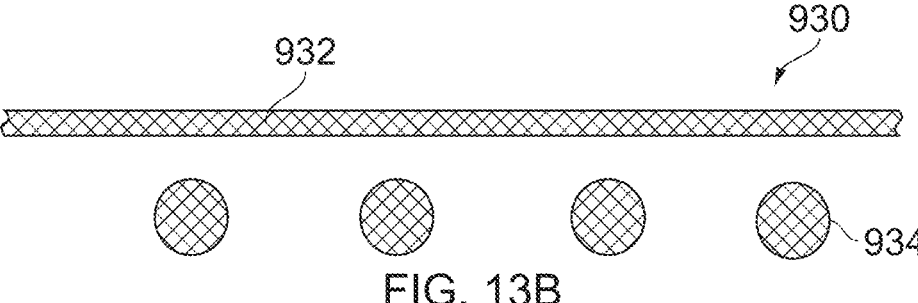
Figure 13C:
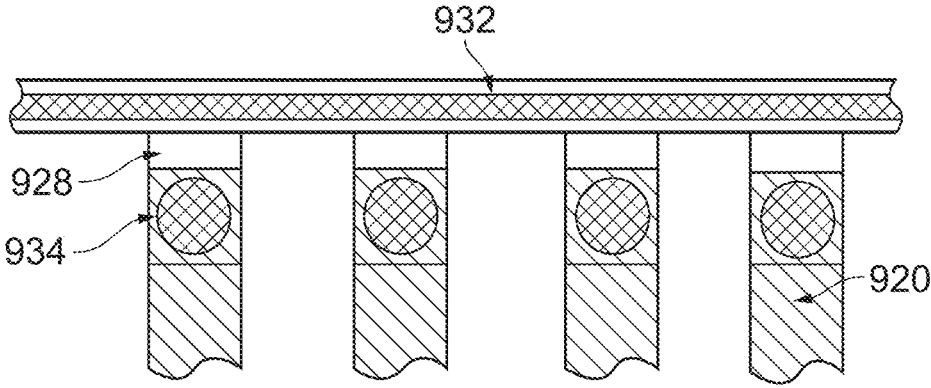

FIGS. 13A-C illustrate an example of how the TMR film 908 may be fabricated. As will be appreciated, the ASIC die 900, first metal layer 902, vias 906 and IMD oxide layer 908 may be fabricated using the methods described previously. Once the blanket TMR film 904 has been deposited and magnetically annealed, a two-step patterning process is then performed. In the first step, as exemplified by FIG. 13A, a first mask 924 may be applied to etch a first pattern in the entire TMR film 904 comprising a first track portion 926 and plurality of protrusions 928. As exemplified in FIG. 13B, a second mask 930 is then used to etch the TMR resistor tracks that will form the MT sensor spiral (i.e., portion A) and the read-out pillars (i.e., portion B). In this respect, the second mask 930 comprises a second track portion 932 and pillars 934. The resulting configuration is illustrated schematically by FIG. 13C. When the second mask 930 is applied, the TMR film 904 is only etched down to the reference/pinned layers 910 or bottom electrode, such that reference/pinned layers 910 and/or bottom electrode in the region of the protrusions 928 forms an electrical connection point between the tracks of the MT sensor spiral (i.e., portion A) and the read-out pillars (i.e., portion B). The further metal layer 920 is then deposited over the top of the read-out pillars 934, thereby providing a chain of electrical contacts along the length of the sensor spiral.

Figure 14:
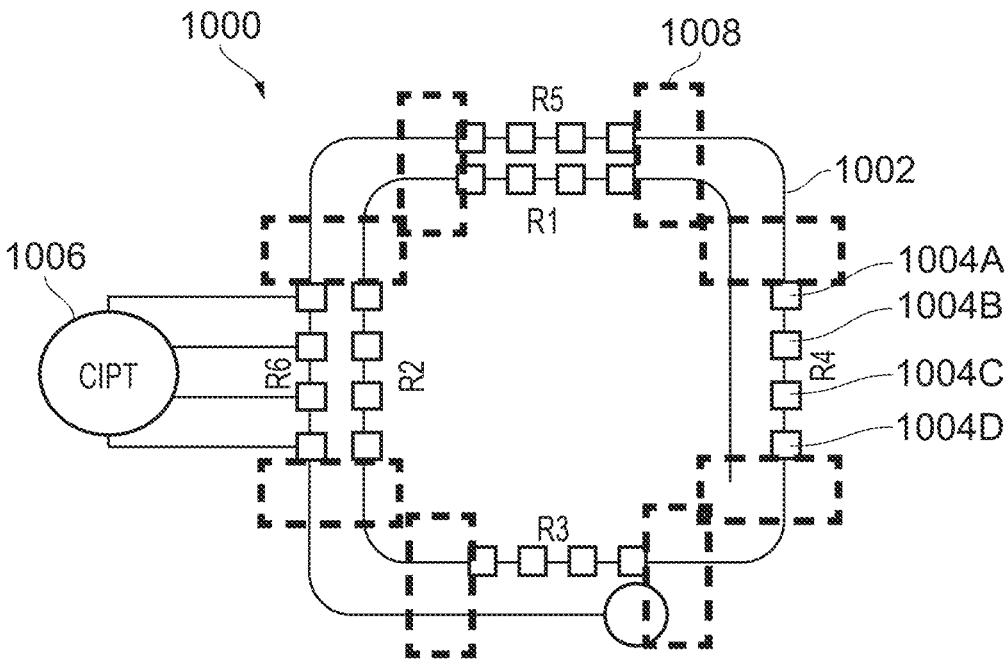
FIG. 14 illustrates a tunnel magnetoresistive multi-turn sensor spiral in accordance with the present disclosure.

FIG. 14 illustrates how CIPT readout of a TMR-based sensor spiral 1000 may allow the size of a MT sensor to be significantly reduced. The MT sensor 1000 comprises a TMR film 1002 (which may be any of the TMR films described above), the TMR film 1002 being divided into a plurality of sensing lengths R1-R6, wherein each sensing length R1-R6 has four electrical contacts 1004A-D disposed along its length, preferably, equidistantly. However, as described previously, it will be appreciated that the TMR-based MT sensor 1000 may be implemented using just two electrical contacts, e.g., contacts 10004A, 1004D. The electrical contacts 1004A-D may be implemented using any of the methods described with reference to FIGS. 6-13. The electrical contacts 1004A-D of each sensing length R1-R6 are connected to CIPT circuitry 1006.

As the electrical contacts 1004A-D can be provided close to each other, compared to the contacts 12 and 14 in a GMR-based implementation such as that shown in FIGS. 1A-1B, this enables each leg of the spiral to be shortened. That is to say, the portions circled (e.g., at 1008), are not needed and can therefore be removed, thereby creating a tighter and thus smaller sensor spiral. As such, a sensor spiral having more turns (and thus capable of sensing more turns) can be provided on smaller surface area.

An alternative approach to implementing a TMR multi-turn sensor in accordance with the present disclosure will now be described, wherein the sensor read-out is provided by a read-out pillar formed from TMR material.

Figure 15:
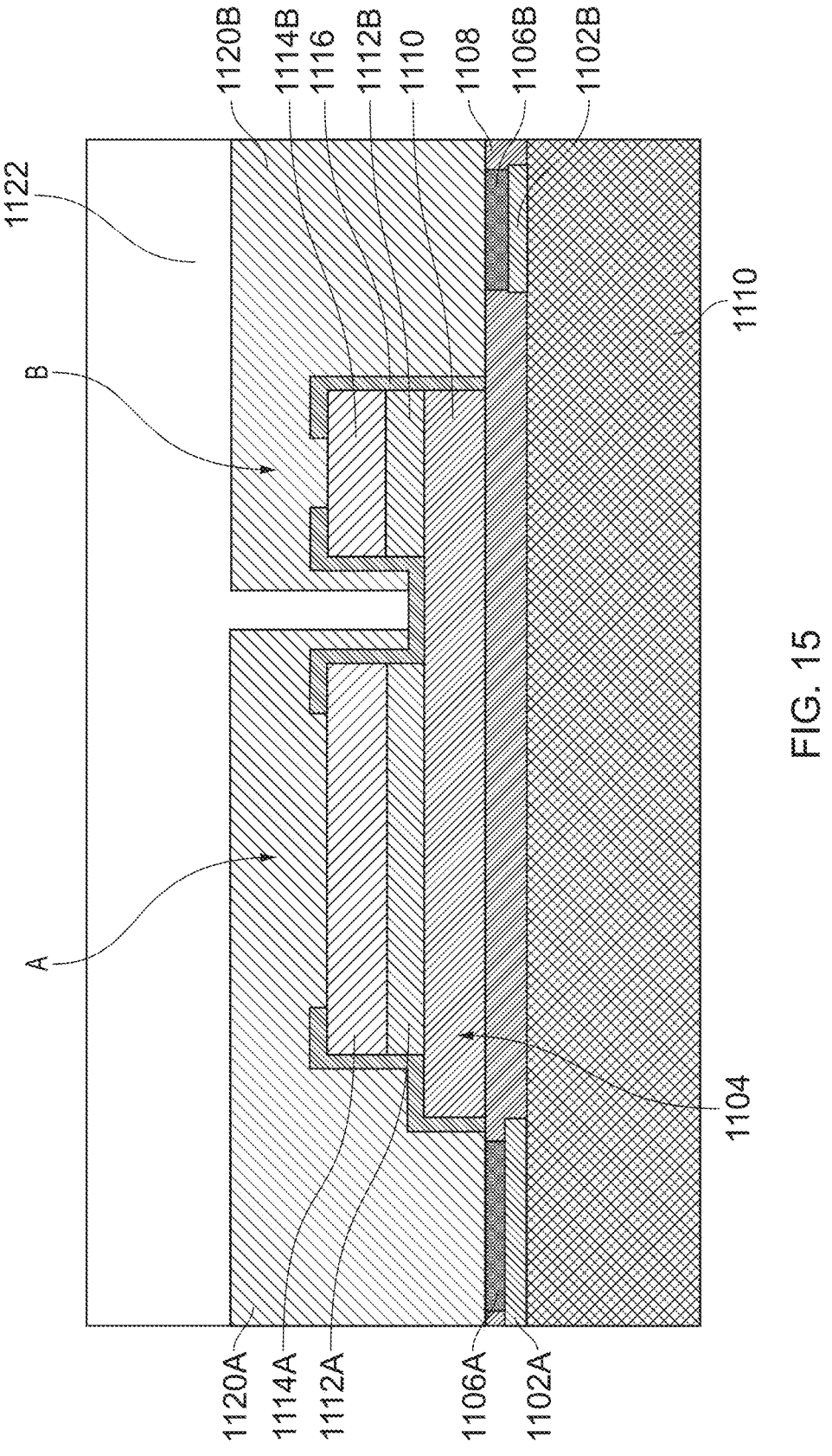
FIG. 15 illustrates another example of a tunnel magnetoresistive multi-turn sensor in accordance with the present disclosure.

FIG. 15 illustrates an example of a TMR multi-turn sensor in accordance with the present disclosure, wherein the sensor read-out is provided by a TMR read-put pillar using perpendicular-to-plane current flow measurements. The overall structure of the sensor is similar to that described with reference to FIG. 12, however, the first metal layer 1102B and a set of vias 1106B are also provided in the region of the tracks of the sensor spiral (portion "B"), with a further metal layer 1120B also being provided over the tracks of the sensor spiral (i.e., portion B) to connect the ferromagnetic free layer 1114B to the vias 1106B. The sensor read-out can then be performed through the pillar (portion "A"). One particular advantage of such an arrangement is that a larger change of resistance will be observed as an external magnetic field rotates, thus reducing the likelihood of an error in the turn count. In this respect, all of the applied current must pass through the tunnel barrier layer 1112B of the tracks of the sensor spiral B, which provides the main portion of the measured resistance, and thus the observed resistance change is dependent only on this current passing through the tunnel barrier layer 1112B. This is in contrast to the CIPT arrangements described above with contacts on only one side of the TMR film, wherein a portion of the current flows through only the free layer between the two contacts without passing through the tunnel barrier layer barrier, thus creating a parallel resistor shunting the actual measured resistance and its change, which leads to lower observed resistance change. Furthermore, only two electrical contacts per sensing element are required; one for the readout pillar and one for the sensing element. In some cases, as will be described in more detail below, one read-out pillar can be used for multiple sensing elements, further reducing the overall number of electrical contacts needed.

FIGS. 16A-E illustrate a number of ways in which the TMR-based MT sensor with pillar read-out may be implemented.

Figure 16A:
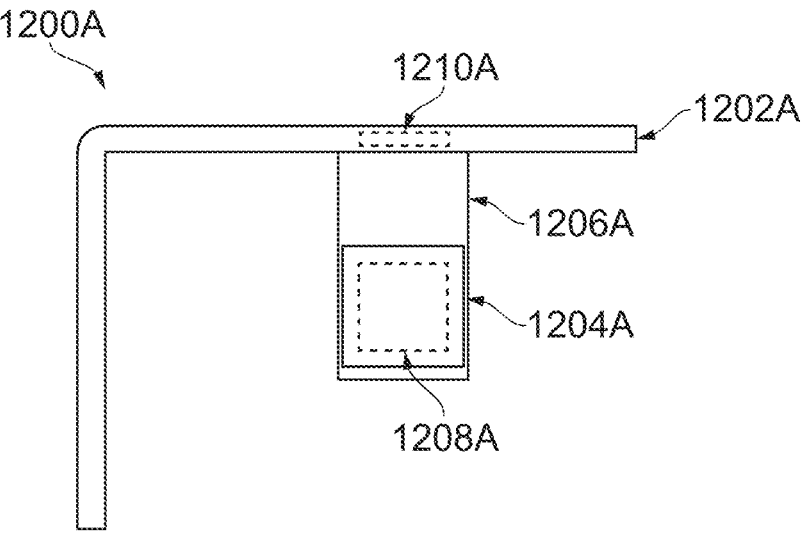
FIGS. 16A-E illustrate examples of part of a tunnel magnetoresistive multi-turn sensor in accordance with the present disclosure.

FIG. 16A illustrates a first method of implementing a TMR-based MT sensor with pillar read-out. FIG. 16A shows a top view of part of the sensor spiral 1200A, where one of the sensing elements is shown generally at 1202A and its respective read-out pillar is shown at 1204A. The sensing element 1202A corresponds to the tunnel barrier 1112B and free layer 1114B shown in FIG. 15, whilst the read-out pillar 1204A corresponds to the tunnel barrier 1112A and free layer 1114A shown in FIG. 15. The sensing element 1202A and the read-out pillar 1204A are electrically connected by the bottom electrode 1206A of the TMR film (i.e., portion 1110 shown in FIG. 15). As described above, this bottom electrode 1206A may also comprise the reference and pinned layers of the TMR film. As shown in FIG. 16A, the read-out pillar 1204A has a top contact area shown at 1208A (i.e., the top metal layer 1120A of FIG. 15) and the sensing element 1202A has a top contact area shown at 1210A (i.e., the top metal layer 1120B of FIG. 15).

Whilst the read-out pillar 1204A is shown as having a square configuration, it will be appreciated that the read-out pillar 1204A may have a circular configuration or any suitable configuration provided that the resistance of the sensing elements 1202A is substantially larger than the resistance of the read-out pillar 1204A. That is to say, the top contact area 1208A of the read-out pillar 1204A must be much larger than the top contact area 1210A of the sensing element 1202A. The magnetisation direction of the free layer of the read-out pillar 1204A follows the externally applied magnetic field and forms a parasitic TMR resistor. However, because its resistance is small compared to the sensing element 1202A, its influence on the output signal will be small and thus the output signal measured at the read-out pillar 1204A reflects the change in resistance observed in the sensing element 1202A.

Figure 16B:
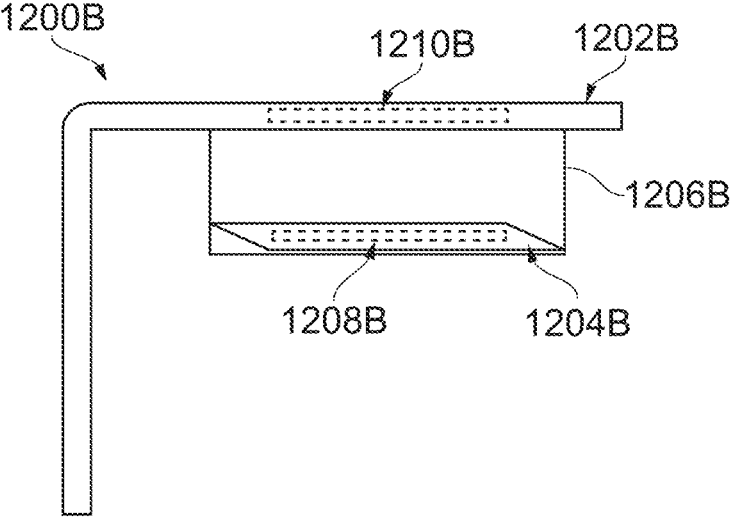

FIG. 16B shows a further method of implementing a TMR-based MT sensor with pillar read-out. FIG. 16B is similar to that of FIG. 16A, however, in this example the read-out pillar 1204B is shaped with a high aspect ratio, and so the observed change in resistance in the sensor spiral will be half compared to that of the arrangement shown in FIG. 16A. However, this allows for shorter sensing elements 1202B and tighter packing of the spiral 1200B compared to the example shown in FIG. 16A. In this example, the magnetization within the free layer of the readout pillar 1204B is held in stable orientation (either pointing left or right, depending on the direction set during initialisation) by large shape anisotropy as a result of the high aspect ratio and the sharp ends of the read-out pillar 1204B. This again forms a parasitic TMR resistor connected in series with the sensing element 1202B, but the parasitic resistor value is constant, and therefore the overall change of resistance observed is only due to the change of resistance of the sensing element 1202B.

Figure 16C:
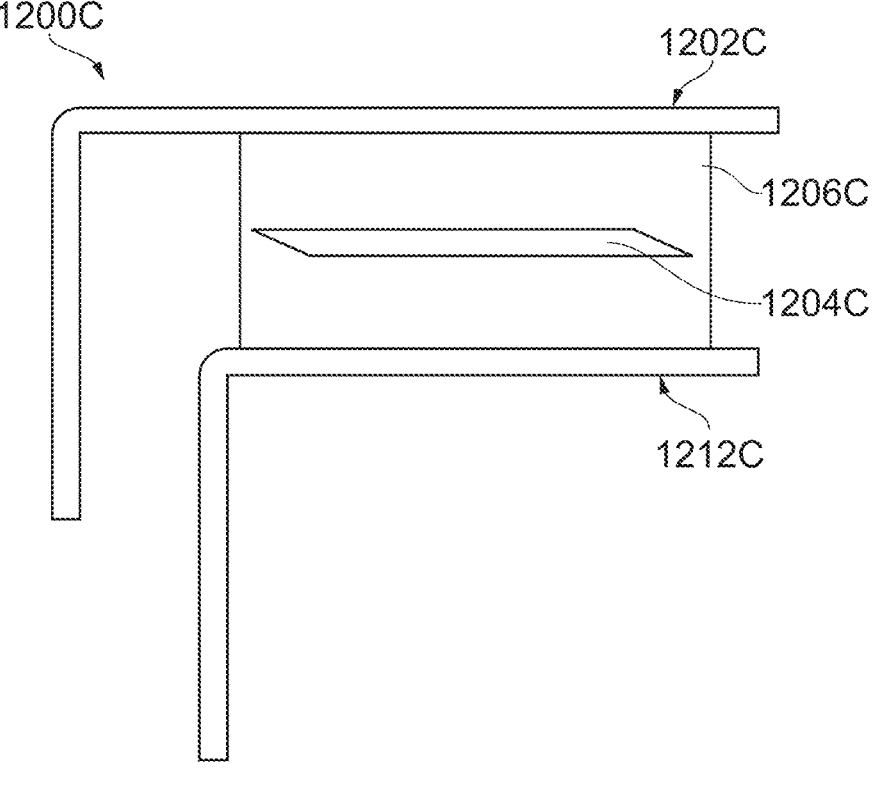

FIG. 16C shows a further method of implementing a TMR-based MT sensor with pillar read-out. FIG. 16C is similar to that of FIG. 16B, however, in this example the read-out pillar 1204C is connected to a neighbouring sensing element 1212C within the sensor spiral 1200C. That is to say, the read-out pillars 1204C may be provided between respective windings of the sensor spiral 1200C such that they are connected between two sensing elements 1202C, 1212C. Again, this allows the windings of the spiral 1200C to be packed together more tightly by reducing the number of read-out pillars 1204C required.

Figure 16D:
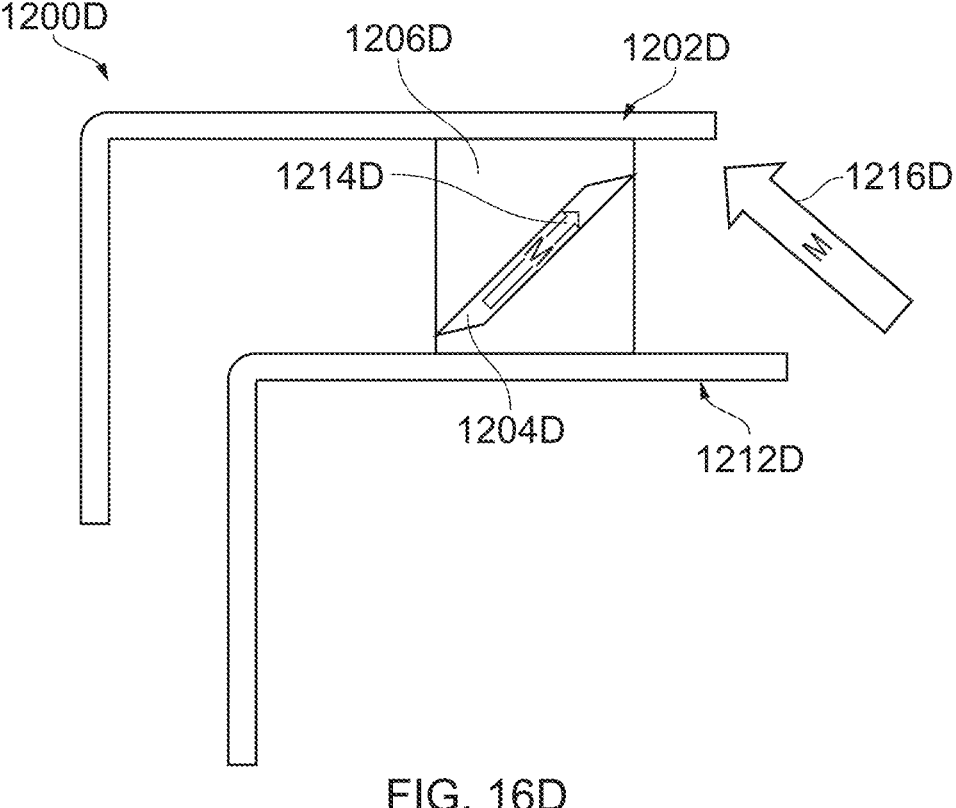

FIG. 16D shows a further method of implementing a TMR-based MT sensor with pillar read-out. FIG. 16D is similar to that of FIG. 16C, however, in this example the read-out pillar 1204D is rotated 45 degrees relative to the sensing elements 1202D, 1212D, such that no resistance change is observed. In a four-sided spiral configuration, the magnetisation of the reference layer is oriented 45° (shown generally by arrow 1216D) relative to the sensing elements 1202D, 1212D of each leg (horizontal and vertical). In this type of sensor, the magnetization of the pinned layer is typically fixed in the same direction for all parts of sensor. This way, if magnetization orientation of each leg of the spiral changes (i.e., between parallel and antiparallel to its length), a change of resistance change can be observed that is equal to TMR effect divided by $\sqrt{2}$. See for example, FIG. 3B, where corresponding points on the graph are angles of 45° and 225°. As such, if the read-out pillars 1204D are arranged at 45° to the sensing elements 1202D, 1212D, the read-out pillars 1204D will have either no change of resistance when the magnetization direction changes (corresponding to angles 90° and 270° in FIG. 3B) or a full amplitude of resistance change (corresponding to angles 0° or 180° in FIG. 3B), depending on whether they are orientated parallel or perpendicular to the magnetization 1216D of the reference layer. The read-out pillars 1204D are therefore arranged so that magnetization of the free layer (shown generally by arrow 1214D) is perpendicular to the magnetization 1216D of the reference layer. Consequently, even if the magnetization 1214D in the read-out pillar 1204D switches to the opposite orientation, there is no change of parasitic resistance observed in the read-out pillar 1204D, thus no effect on the readout of the sensing elements 1202D, 1212D.

Figure 16E:
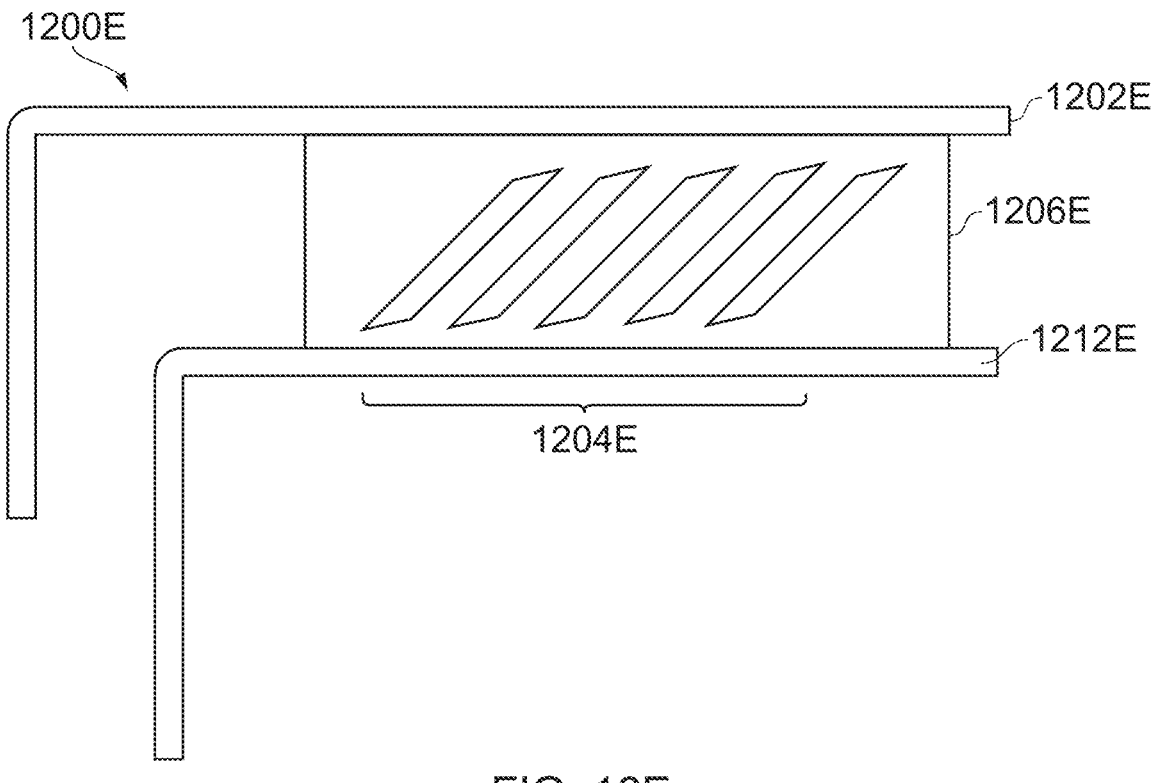

FIG. 16E shows a further method of implementing a TMR-based MT sensor with pillar read-out. FIG. 16E is similar to that of FIG. 16D, however, in this example there are multiple parallel read-out pillars 1204E. Here, there is still no resistance change observed, but a larger overall contact area and thus a lower parasitic resistance can be achieved. This can be particularly beneficial since parasitic resistance can degrade the useful signal amplitude.

Figure 17A:
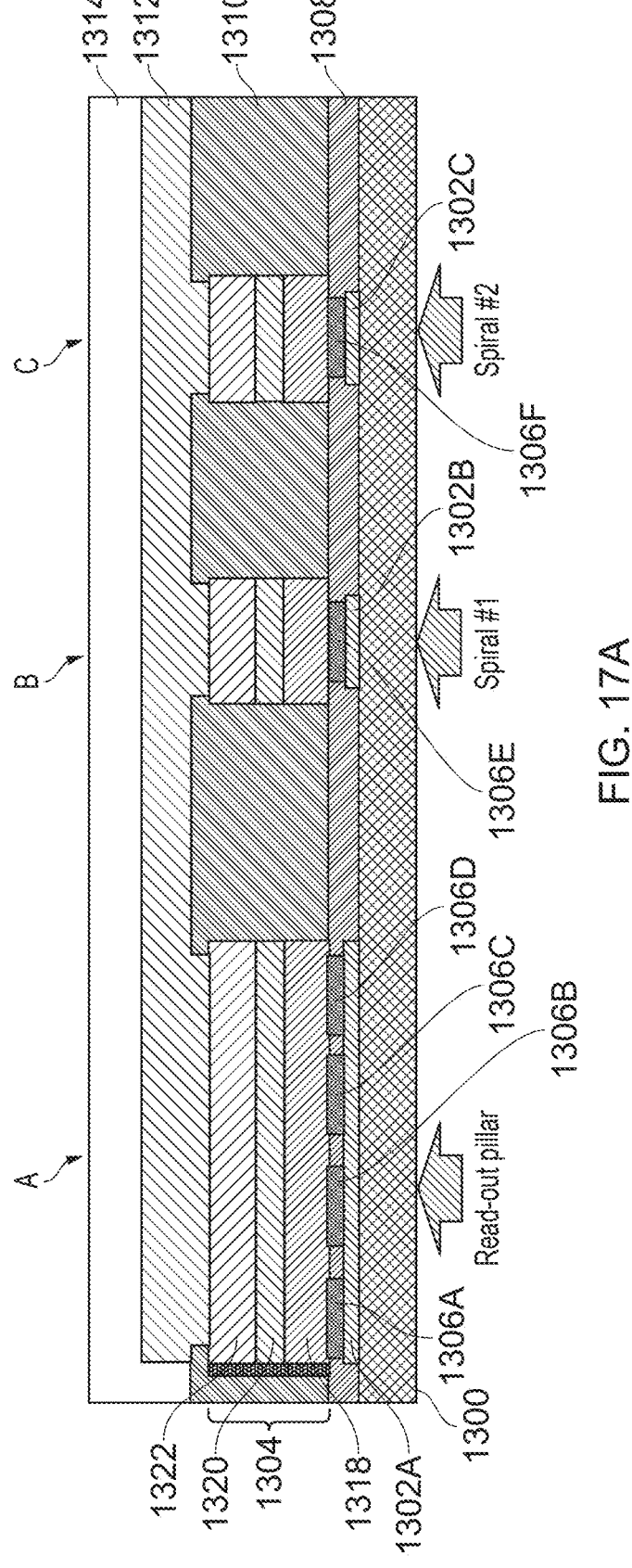
FIGS. 17A-B illustrates another example of a tunnel magnetoresistive multi-turn sensor in accordance with the present disclosure.
Figure 17B:
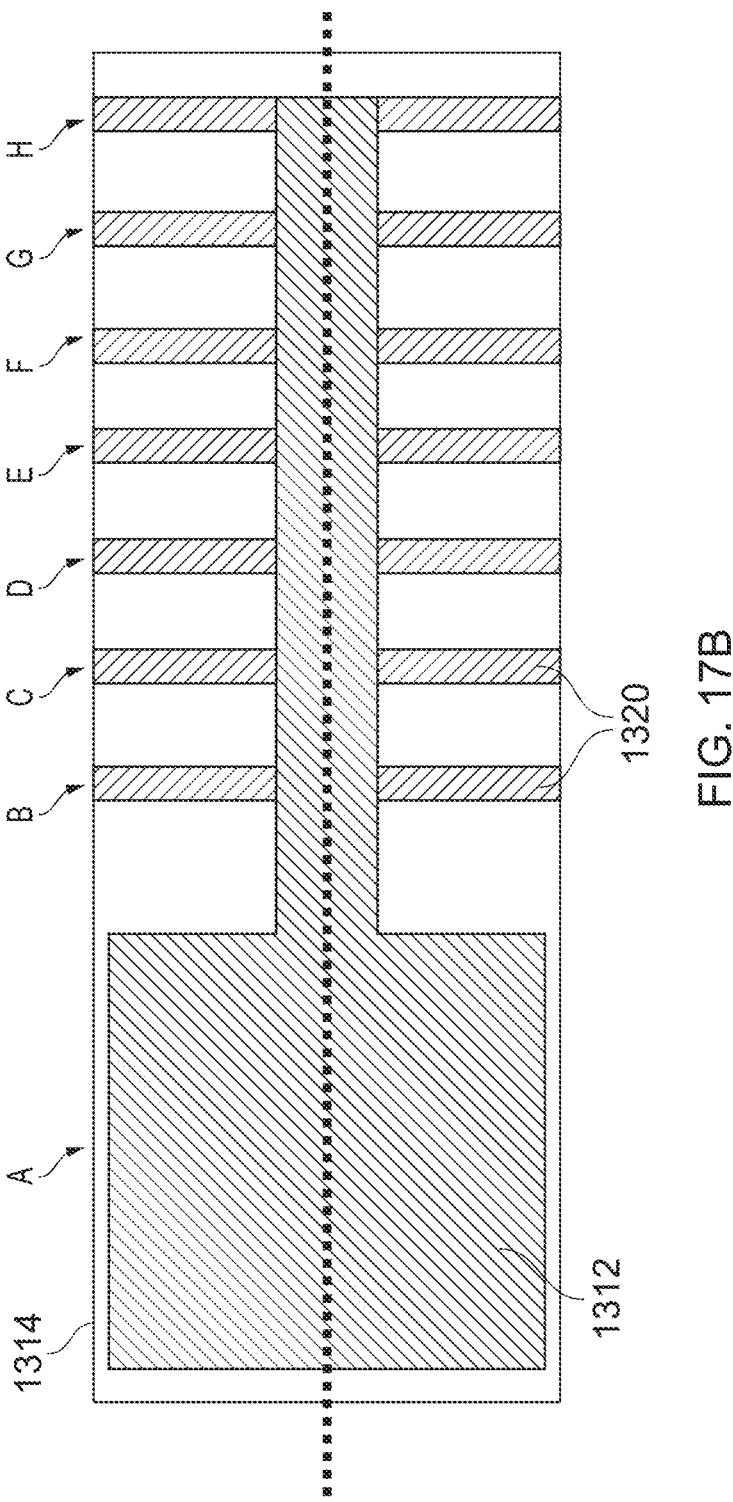

FIGS. 17A-B illustrate a further example of a TMR multi-turn sensor in accordance with the present disclosure, wherein the sensor read-out is provided by a monolithic TMR pillar using perpendicular-to-plane current flow measurements. FIG. 17A is a cross-sectional view of part of a TMR-based MT sensor comprising an application specific integrated circuit (ASIC) die 1300 that is typically formed onto a laminate substrate such as a printed circuit board (PCB) substrate, ceramic substrate, or any suitable type of substrate. A metal layer 1302 is deposited on to the ASIC die 1300 for providing an electrical connection with the circuitry components, the top metal layer 1302A-C being patterned (e.g., via lithography and etching) so as to provide connection points for the read-out pillar (shown generally at A) and the sensing elements (shown generally at B and C), as will be described further below. The metal layer 1302A-C may be formed from any suitable top metal material, such as aluminium, copper or stainless steel.

A layer of intermetal dielectric (IMD) oxide 1308, such as silicon oxide, is disposed onto the ASIC die 1300 and metal layer 1302A-C. A plurality of vias 1306A-F are then formed (e.g., by lithography and etching) in the IMD oxide 1308 in the region of each metal layer 1302A-C, the via 1306A-F being filled (e.g., by deposition) with a plug made from any suitable material, such as tungsten. Both the IMD oxide 1308 and the plugged vias 1306A-F may undergo a process of chemical-mechanical planarization may be performed at this stage in order to ensure the substrate is smooth and planarized before the TMR film is deposited. In the region of the read-out pillar A, four vias 1306A-D may be provided in a similar configuration to that shown in FIG. 6B. Each sensing element B, C is then provided with a single via 1306E, 1306F.

A blanket TMR film 1304 is then deposited and undergoes magnetic annealing in order to set the magnetisation directions of the reference layer and the free layer in the TMR film 1304. It will however be appreciated that the magnetic annealing process may be performed at a later stage. As before, the TMR film 1304 comprises an antiferromagnetic pinning layer and a ferromagnetic reference layer (shown here as a single layer 1318), a tunnel barrier layer 1320 and a ferromagnetic free layer 1322. Again, as noted previously, the TMR film 1304 will be typically provided with a thin layer of metal (not shown) as a bottom layer, to provide the electrical contact with the vias 1306A-F. The TMR film 1304 will be patterned (e.g., via lithography) to form the read-out pillar A, and a plurality of tracks (e.g., B and C) forming an open or closed loop spiral configuration. It will of course be appreciated that only two of tracks defining sensing elements are shown here for exemplary purposes, and in practice each sensor will comprise a plurality of sensing elements.

A protective layer 1310 is then deposited over the substrate, which may be formed of any suitable material, such as aluminium oxide. A portion of the protective layer 1310 will then be etched in order to provide openings to expose the free layer 1320 of the read-out pillar A and the sensing elements (e.g., B and C). A further metal layer 1312 is then formed over the read-out pillar A and sensing elements (e.g., B and C) to thereby electrically connect the read-out pillar A with the sensing elements of the sensor spiral.

Finally, a passivation layer 1314, for example, a silicon nitride layer, is deposited to mechanically protect the sensor from moisture. In this example, the passivation layer 1314 is shown as a single layer of material, however, it will be appreciated that the passivation layer 1314 may also be formed of multiple layers of different materials.

FIG. 17B shows a top view of the resulting sensor, wherein the further metal layer 1312 is provided over the read-out pillar A, and each sensing element B-H of one side of the sensor spiral. In this respect, it will be appreciated that a read-out pillar may be provided for each side of the sensor spiral (e.g., in a four side sensor spiral). The contact area of the read-out pillar is significantly larger than that of the sensing elements B-H, and so the resistance change observed in the read-out pillar A is significantly lower than that observed in the individual sensing elements B-H. Consequently, the resistance change in the read-out pillar A will not impact the output of the sensor. In use, a current may be applied in sequence between the read-out pillar A and each of the sensing elements B-H to measure the resistance change in each leg of the spiral.

Whilst FIG. 17B shows an arrangement where a single read-out pillar A is provided for each side of the sensor spiral, it will be appreciated that other arrangements may be provided to provide alternative read-out schemes. For example, on each side of the sensor spiral, the read-out pillar may be split into two separate read-out pillars that may be connected in series for pillar resistance measurements and then in parallel for sensor spiral readout. The resistance of the two connected read-out pillars may then be measured, divided by 2 and then subtracted from the resistance measured across the sensing elements B-H to compensate for the change in resistance in the read-out pillars. In another arrangement, the read-out pillar may be again split into two separate read-out pillars and connected as a Kelvin bridge arrangement, with one pillar being used to measure current and the other pillar being used to measure voltage. In such arrangements, the read-out pillars may both be provided on the outside of the sensor spiral, or one read-out pillar could be provided on the inside of the sensor spiral.

Figure 18:
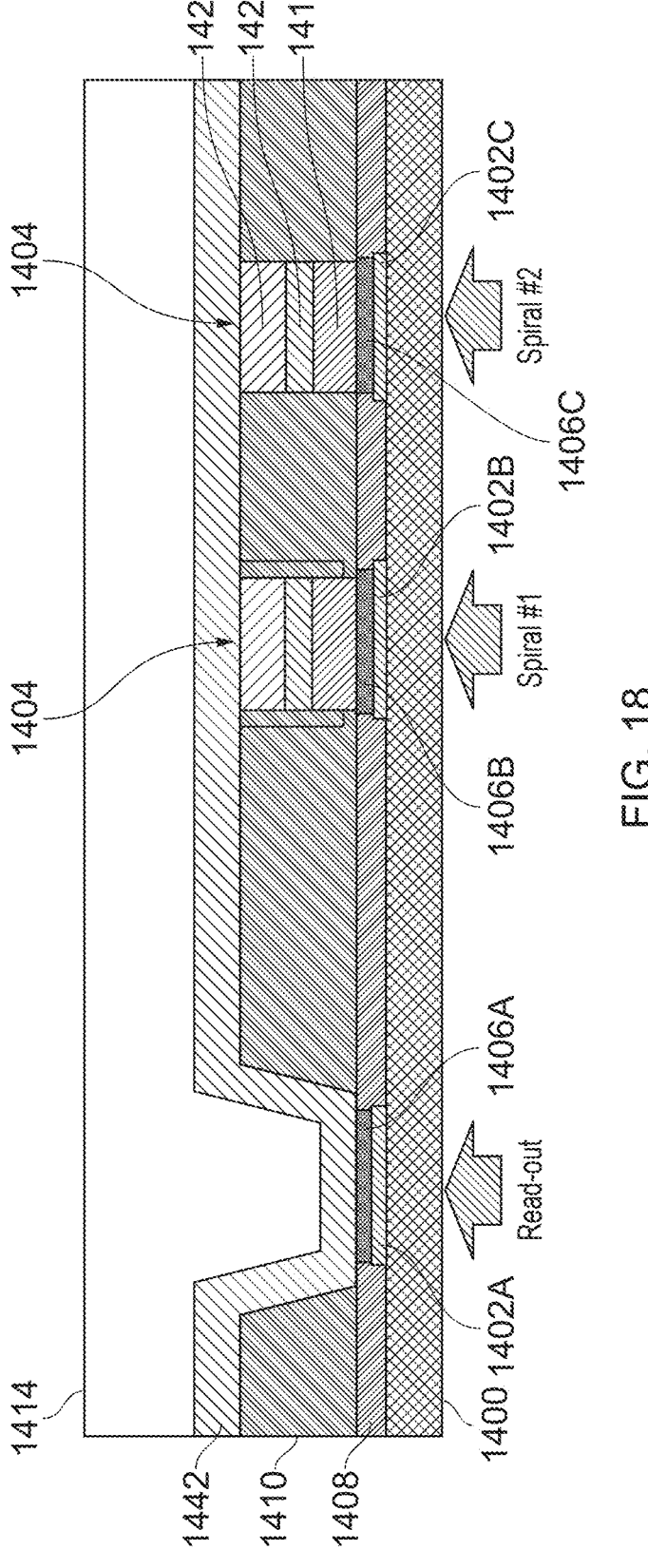
FIG. 18 illustrates another example of a tunnel magnetoresistive multi-turn sensor in accordance with the present disclosure.

FIG. 18 illustrates a further example of a TMR multi-turn sensor in accordance with the present disclosure. FIG. 18 is similar to that of FIG. 17A, however, instead of a read-out pillar, the further layer of metal 1412 is connected directly to the top metal layer contact 1402A by a via 1406A. As before, a current may be applied in sequence between the top metal layer contact 1402A and each sensing element to measure the resistance change in each leg of the spiral.

In all of the above examples, a MT sensor spiral of reduced size that uses a shorter length of sensing material can be provided. By reducing the amount of sensing material required, defectivity in the sensor is reduced, which lead to a higher device yield. Furthermore, a smaller sensor die can be used, which in turn reduces the overall cost. Further benefits include:

- a higher number of turns/area compared to GMR based multi-turn sensing devices;
- a high signal-to-noise ratio due to a higher amplitude of TMR effect compared to GMR effect, resulting in reduced demand on read-out electronics, increased noise immunity, and lifetime drift immunity;
- a very thick free layer can be used for counting the number of turns, which enables a higher operating magnetic field window and thus suitable for use with large external magnetic fields;
- an inherently high resistance means that the device can work in a lower power system.

Various modifications, whether by way of addition, deletion and/or substitution, may be made to all of the above described embodiments to provide further embodiments, any and/or all of which are intended to be encompassed by the appended claims.

In the examples described herein, the TMR film is shown as having the pinned/reference layer on the bottom and the ferromagnetic free layer on the top. However, in some cases, the TMR film may be provided with the free layer provided on the bottom and the pinned/reference layer provided on the top, depending on the resistances of the materials used.

Figure 21:
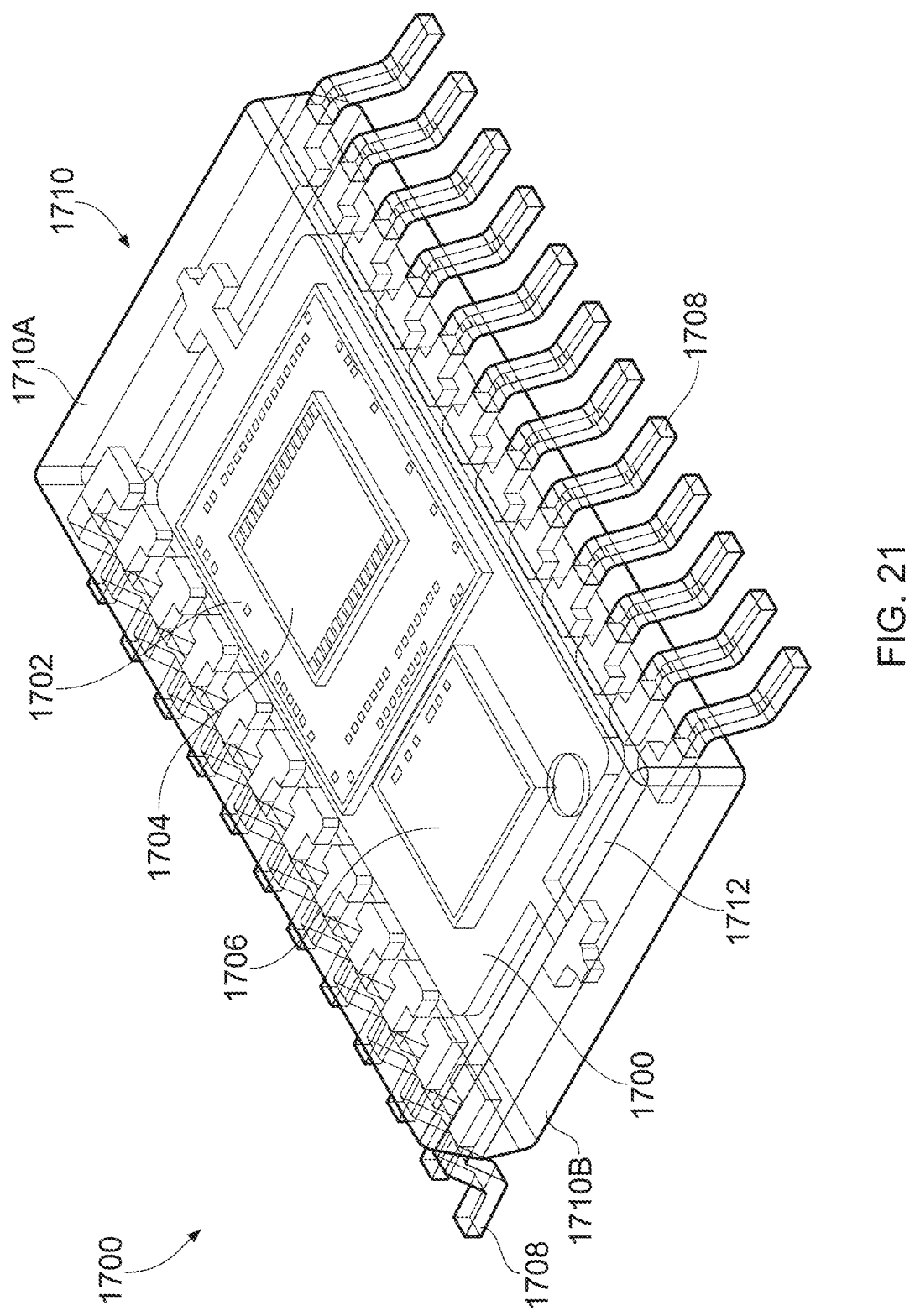
FIG. 21 illustrates an example of a magnetic sensor package in accordance with an embodiment of the disclosure.

FIG. 21 illustrates an example of a magnetic sensor package 1700 in accordance with an embodiment of the present disclosure. The magnetic sensor package 1700 comprises a package substrate 1700, also referred to as the lead frame paddle, which may comprise a laminate substrate such as a printed circuit board (PCB) substrate, ceramic substrate, or any suitable type of substrate. An application specific integrated circuit (ASIC) die 1702 is formed onto the package substrate 100, upon which a first integrated device die 1704 is stacked, the first integrated die 1704 in this case comprising a magnetic multi-turn (MT) sensing element configured to count the number of turns in a rotating magnetic field. In this respect, the magnetic multi-turn sensor may be any of the tunnel magnetoresistive multi-turn sensors described herein. Optionally, a second integrated device die 1706 may be provided on the substrate 1700, adjacent to the ASIC die 1702 and MT sensor die 1704 stack, the second integrated device die 1706 comprising a magnetic single turn (ST) sensor configured to measure the angular position of a rotating magnetic field. In this respect, the magnetic single turn (ST) sensor may be an anisotropic magnetoresistance (AMR), tunnel magnetoresistance (TMR), giant magnetoresistance (GMR), Hall or any other magnetic based angle sensor.

The ASIC die 1702, multi-turn sensor die 1704 and angle sensor die 1706 can be assembled and fixed to the substrate 1700 in any suitable way, for example, using an epoxy die attach or a die attach film (DAF). Preferably, by using a DAF, there are no concerns about epoxy material bleeding over the edge of the substrate 1700. As a result, the ASIC die 1702 and multi-turn sensor die 1704 stack, as well as the angle sensor die 1706, can be located close to the edge of the substrate 1700, which may be preferable in applications where the sensor package 1700 is positioned away from the rotational axis of the magnet. Furthermore, the use of DAF can prevent movement of the sensor dies 1704 and 1706 once the package 1700 has been assembled and is in use, whereas the use of epoxy die attach can experience flow and shrink during the curing process.

The package substrate 1700 includes leads 1708 on the lower surface thereof to facilitate electrical connection to other electronic systems, for example, by way of another board, such as a printed circuit board. The package substrate 1700 and leads 1708 together can be considered the lead frame of the magnetic sensor package 1700. The package substrate 1700, ASIC die 1702, multi-turn sensor die 1704 and angle sensor die 1706 are all housed within a moulded package body 1710. For example, the package body 1710 may comprise a non-conductive moulding comprising a dual sided construction. As such, the moulded package body 1710 may comprise two hollow components 1710A, 110B that are attached around the edges, for example, by way of thermal plastic welding or joining techniques such as thermal compression bonding, to form a housing. Electrical connections 1712 between the dies 1702, 1704 and 1706 and the leads 1708 may also be housed within the moulded package body 1710.

Whilst FIG. 21 shows an arrangement where the multi-turn sensor die 1704 is stacked onto the ASIC die 1702 with an angle sensor die 1706 placed adjacent thereto, it will be appreciated that other arrangements may be provided. For example, the tunnel magnetoresistive multi-turn sensor may be monolithically integrated onto the ASIC die 1702, such that only one integrated device die is provided. Similarly, the angle sensor die 1706 may also be provided on top of a stack comprising the ASIC sensor die 1702 and multi-turn sensor die 1704 (or on top of a single integrated device die comprising both the ASIC and the tunnel magnetoresistive multi-turn sensor components), which may be advantageous to ensure that both the multi-turn sensor and the angle sensor are placed at the centre of an external rotating magnetic field. Alternatively, a single integrated device die may be provided comprising the ASIC, the tunnel magnetoresistive multi-turn sensor and the magnetic angle sensor.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for shielding stray magnetic fields from a magnetic sensor system comprising a magnetic sensor.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, cars, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A magnetic multi-turn sensor, comprising:
   a length of tunnel magnetoresistive film arranged in a spiral configuration;
   a substrate on which the tunnel magnetoresistive film is formed; and
   a plurality of contacts for electrically connecting the tunnel magnetoresistive film, such that a plurality of tunnel magnetoresistive sensor elements connected in series are defined by said contacts, wherein the plurality of contacts are provided in a first plane above or below the tunnel magnetoresistive film, wherein a width of a via corresponding to respective ones of the plurality of contacts is substantially alike with a width of tunnel magnetoresistive film, wherein each tunnel magnetoresistive sensor element is connected to four or more contacts arranged in a substantially linear fashion.

2. The magnetic multi-turn sensor according to claim 1, wherein the plurality of contacts are provided between the substrate and the tunnel magnetoresistive film.

3. The magnetic multi-turn sensor according to claim 2, wherein each of the plurality of contacts comprise a first metal layer, and a via provided between the first metal layer and the tunnel magnetoresistive film.

4. The magnetic multi-turn sensor according to claim 2, wherein individual ones of the plurality of contacts is provided at a position directly under a section of the tunnel magnetoresistive film.

5. The magnetic multi-turn sensor according to claim 2, wherein individual ones of the plurality of contacts is provided at a position offset from a section of the tunnel magnetoresistive film.

6. The magnetic multi-turn sensor according to claim 5, wherein each of the plurality of contacts is connected to the tunnel magnetoresistive element by a second metal layer extending between each via and the respective section of the tunnel magnetoresistive film.

7. The magnetic multi-turn sensor according to claim 2, wherein the length of tunnel magnetoresistive film comprises a plurality of tunnel magnetoresistive read-out pillars connected thereto, wherein each of the plurality of contacts is connected to a respective tunnel magnetoresistive read-out pillar.

8. The magnetic multi-turn sensor according to claim 7, wherein the tunnel magnetoresistive read-out pillars have a larger surface area than a surface area of each tunnel magnetoresistive sensor element of the tunnel magnetoresistive film.

9. The magnetic multi-turn sensor according to claim 1, wherein the plurality of contacts are provided above the tunnel magnetoresistive film.

10. The magnetic multi-turn sensor according to claim 9, wherein the plurality of contacts are formed in one or more protective layers formed on the tunnel magnetoresistive film.

11. The magnetic multi-turn sensor according to claim 10, wherein the one or more protective layers comprises at least a first protective layer formed on the tunnel magnetoresistive film, the first protective layer comprising a plurality of openings to the tunnel magnetoresistive film.

12. The magnetic multi-turn sensor according to claim 11, wherein each of the openings is filled with a conductive material.

13. The magnetic multi-turn sensor according to claim 12, wherein a metal layer is formed onto the conductive material of each respective opening to thereby provide one of the plurality of contacts.

14. The magnetic multi-turn sensor according to claim 11, wherein the one or more protective layers further comprise a second protective layer formed on the first protective layer, the first protective layer having a thickness substantially smaller than a thickness of the second protective layer.

15. The magnetic multi-turn sensor according to claim 1, wherein each tunnel magnetoresistive sensor element is connected to two or more contacts.

16. The magnetic multi-turn sensor according to claim 15, wherein the two or more contacts are electrically connected to provide current in-plane tunnelling magnetoresistance measurements.

17. A magnetic multi-turn system, comprising:

at least one integrated device die comprising:

a magnetic multi-turn sensor, comprising:

a length of tunnel magnetoresistive film arranged in a spiral configuration;

a substrate on which the tunnel magnetoresistive film is formed; and a plurality of contacts for electrically connecting the tunnel magnetoresistive film, such that a plurality of tunnel magnetoresistive sensor elements connected in series are defined by said contacts, wherein the plurality of contacts are provided in a first plane above or below the tunnel magnetoresistive film, wherein a width of a via corresponding to respective ones of the plurality of contacts is substantially alike with a width of tunnel magnetoresistive film, wherein each tunnel magnetoresistive sensor element is connected to four or more contacts arranged in a substantially linear fashion; and processing circuitry configured to process a signal output from the magnetic multi-turn sensor to determine a number of turns of an external magnetic field therefrom; and a package substrate, wherein the at least one integrated device die is mounted onto the package substrate.

18. The magnetic multi-turn system according to claim 17, wherein the at least one integrated device die comprises a first integrated device die comprising the magnetic multi-turn sensor, and a second integrated device die comprising the processing circuitry.

19. The magnetic multi-turn system according to claim 18, wherein the first integrated device die is formed on the second integrated device die.

20. The magnetic multi-turn system according to claim 17, wherein:

for a respective tunnel magnetoresistive sensor element, the processing circuitry is configured to determine a reference value from a first pair of the four or more contacts and an indication of the tunnel magnetoresistive effect from a second pair of the four or more contacts.

* * * * *